United States Patent
Kanno et al.

(10) Patent No.: US 7,814,343 B2
(45) Date of Patent: Oct. 12, 2010

(54) SEMICONDUCTOR INTEGRATED CIRCUIT FOR REDUCING POWER CONSUMPTION AND ENHANCING PROCESSING SPEED

(75) Inventors: Yusuke Kanno, Kodaira (JP); Hiroyuki Mizuno, Musashino (JP); Naohiko Irie, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 819 days.

(21) Appl. No.: 11/605,362

(22) Filed: Nov. 29, 2006

(65) Prior Publication Data

US 2007/0136617 A1 Jun. 14, 2007

(30) Foreign Application Priority Data

Nov. 30, 2005 (JP) ............................. 2005-344891

(51) Int. Cl.
G06F 1/00 (2006.01)
G06F 1/26 (2006.01)
G06F 1/32 (2006.01)
G06F 12/00 (2006.01)

(52) U.S. Cl. ...................... 713/300; 713/320; 713/324; 711/141; 257/347; 257/348

(58) Field of Classification Search ................. 713/300, 713/320, 324; 711/141; 257/347, 348
See application file for complete search history.

(56) References Cited

U.S. PATENT DOCUMENTS

| | | | |
|---|---|---|---|
| 6,380,764 B1 | | 4/2002 | Katoh et al. |
| 6,501,999 B1 * | | 12/2002 | Cai .............................. 700/82 |
| 6,631,474 B1 * | | 10/2003 | Cai et al. ..................... 713/300 |
| 7,461,275 B2 * | | 12/2008 | Belmont et al. ............. 713/300 |
| 2002/0095609 A1 | | 7/2002 | Tokunaga .................... 713/300 |
| 2003/0141926 A1 * | | 7/2003 | Mizuno et al. ............... 327/565 |
| 2003/0214001 A1 * | | 11/2003 | Yasuda et al. ................ 257/392 |
| 2004/0158756 A1 * | | 8/2004 | Totsuka et al. .............. 713/323 |
| 2005/0114722 A1 * | | 5/2005 | Tanaka et al. ............... 713/320 |
| 2005/0242398 A1 * | | 11/2005 | Chen et al. ................... 257/348 |
| 2005/0275045 A1 * | | 12/2005 | Anderson et al. ........... 257/408 |
| 2006/0171244 A1 * | | 8/2006 | Ando ........................... 365/233 |

FOREIGN PATENT DOCUMENTS

| | | |
|---|---|---|
| JP | 7-325788 | 12/1995 |
| JP | H11-195976 | 7/1999 |
| JP | 2002-215597 | 8/2002 |
| JP | 2002-288150 | 10/2002 |
| JP | 2005-157620 | 6/2005 |

* cited by examiner

Primary Examiner—Vincent T Tran
(74) Attorney, Agent, or Firm—Miles & Stockbridge P.C.

(57) ABSTRACT

A semiconductor integrated circuit device which consumes less power and enables real-time processing. The semiconductor integrated circuit device includes thermal sensors which detect temperature and determine whether the detection result exceeds reference values and output the result, and a control block capable of controlling the operations of arithmetic blocks based on the output signals of the thermal sensors. The control block returns to an operation state from a suspended state with an interrupt signal based on the output signals of the thermal sensors and determines the operation conditions of the arithmetic blocks to ensure that the temperature conditions of the arithmetic blocks are satisfied. Thereby, power consumption is reduced and real-time processing efficiency is improved.

13 Claims, 18 Drawing Sheets

SEMICONDUCTOR INTEGRATED CIRCUIT FOR REDUCING POWER CONSUMPTION AND ENHANCING PROCESSING SPEED

CLAIM OF PRIORITY

The present application claims priority from Japanese application JP 2005-344891 filed on Nov. 30, 2005, the content of which is hereby incorporated by reference into this application.

FIELD OF THE INVENTION

The present invention relates to a semiconductor integrated circuit, and furthermore, a technique for achieving both a reduction in consumed power and high speed performance therein.

BACKGROUND OF THE INVENTION

A demand for enhancing information processing performance to a microprocessor has been increased from year to year, and an enhancement in an operating frequency of the microprocessor has been executed in order to satisfy the demand. In a current semiconductor integrated circuit (LSI), moreover, most of necessary system functions can be integrated in one chip with the progress of a semiconductor process technology. For example, an audio processing IP (Intellectual Property) and an image processing IP can be integrated together with a CPU (central processing unit). Such a semiconductor chip will be referred to as an "SoC (System-on-a-Chip)". Thus, an integrating force is enhanced so that the SoC mounting a plurality of CPUs in the LSI can also be obtained. Consequently, it is possible to implement a parallel processing on a chip.

There has been known an LSI in which a plurality of CPU cores is provided in an SoC (for example, Patent Document 1). Two microprocessors have different instruction control methods from each other. A core for a high speed operation is set to be an RISC (Reduced Instruction Set Computer) and a CPU core for a low speed operation is set to be a CISC (Complex Instruction Set Computer).

Moreover, there has been known an LSI including two CPU cores to employ microarchitectures having different numbers of pipeline stages (fore example, see Patent Document 2). In the LSI, a CPU core to be operated at a high speed is operated at a high source voltage on a large scale and a CPU core to be operated at a low speed is operated by a CPU core having a low source voltage on a small scale in a small number of pipeline stages.

Furthermore, there has been known an LSI including two CPU cores having different performances from each other due to a deference in a logical synthesis (for example, Patent Document 3). In the LSI, the CPU core to be operated at a high speed is constituted by a transistor having a small threshold and the CPU core to be operated at a low speed is constituted by a transistor having a great threshold.

[Patent Document 1] JP-A-7-325788 Publication
[Patent Document 2] JP-A-2002-215597 Publication
[Patent Document 3] JP-A-2002-288150 Publication

SUMMARY OF THE INVENTION

When a large number of functions are integrated by using a leading-edge process as described above, it is impossible to disregard a leakage current of an SoC. The leading-edge process has a tendency that the leakage current of a single transistor is increased from a physical limitation. Furthermore, the SoC has such a main factor that the number of transistors to be mounted is enormous. In such an Soc, accordingly, reduction in the leakage current is very important.

In a CPU to be mounted on the LSI, moreover, a maximum value of an operating frequency required corresponding to a using scene is generally varied. For example, in a standby of a cell phone, there is no problem even if a very slow operation is carried out. However, it is necessary to carry out an operation at a very high speed when three-dimensional graphics are to be processed. In the case in which such a CPU that an operating speed may be varied depending on the scene is to be created, generally, a device is selected in order to obtain a maximum speed which is required and a logical synthesis is thus executed. According to such a design, however, there is caused an increase in a leakage current to be a side effect for obtaining a high speed operation. For this reason, there is a problem in that a power consumed by the leakage current is unnecessarily increased in the case in which an operation is carried out at a lower speed. In the case in which an LSI is designed, accordingly, the design is carried out in consideration of an upper limit of an amount of the leakage current. For this reason, a maximum operating frequency is to be reduced to carry out the design in some cases.

It is an object of the invention to provide a technique for achieving both a reduction in a consumed power and an enhancement in a calculation processing speed in a semiconductor integrated circuit.

The above and other objects and novel features of the invention will be apparent from the description of the specification and the accompanying drawings.

Brief description will be given to the summary of a representation of the invention disclosed in the application.

More specifically, a semiconductor integrated circuit comprises a first processor to be operated at a first operating frequency, a second processor in which a leakage current is reduced more greatly than the first processor and which is operated at a lower second operating frequency than the first operating frequency, and a selecting portion capable of selectively switching an executing destination of an application software into the first processor and the second processor corresponding to a demand operating speed of the application software. At this time, devices capable of executing an identical instruction set respectively are applied to the first processor and the second processor.

According to the means, the selecting portion selectively switches the executing destination of the application software into the first processor and the second processor corresponding to the demand operating speed of the application software. The first processor and the second processor are caused to enable the execution of the identical instruction set. Therefore, it is also possible to optionally execute the same program in both the first processor and the second processor. By changing the processor for carrying out a calculation processing depending on a task, thus, it is possible to switch a calculating power and to switch a consumed power on a chip level while carrying out a pretension for the software as if the calculation processing is carried out by means of one processor core. Consequently, it is possible to achieve reduction in a consumed power and an enhancement in a calculation processing speed.

At this time, the selecting portion can be constituted to carry out the switching control of the first processor and the second processor through a task.

The first processor and the second processor include an MISFET (Metal Insulator Semiconductor Field Effect Transistor) according to an example of a transistor, and a threshold of the MISFET constituting the first processor can be set to be smaller than that of the MISFET constituting the second processor.

The first processor and the second processor include low threshold MISFETs which are set to be lower than predetermined threshold levels, respectively, and a layout can be carried out in such a manner that a rate of the low threshold MISFET in the first processor is higher than that of the low threshold MISFET in the second processor.

When the first processor and the second processor include the MISFETs respectively, a threshold of the MISFET constituting the first processor can be set to be smaller than that of the MISFET constituting the second processor and an operating voltage of the first processor can be set to be lower than that of the second processor.

When the first processor and the second processor include MISFETs respectively, a thickness of a gate insulating film of the MISFET constituting the first processor can be set to be smaller than that of a gate insulating film of the MISFET constituting the second processor and an operating voltage of the first processor can be set to be lower than that of the second processor.

When the first processor and the second processor include MISFETs respectively, a thickness of a gate insulating film of the MISFET constituting the first processor can be set to be smaller than that of a gate insulating film of the MISFET constituting the second processor, a threshold of the MISFET constituting the first processor can be set to be smaller than that of the MISFET constituting the second processor and an operating voltage of the first processor can be set to be lower than that of the second processor.

When a semiconductor integrated circuit is constituted to comprise a first core including a first CPU and a first cache memory coupled to the first CPU, a second core including a second CPU and a second cache memory coupled to the second CPU, and an input/output circuit capable of transferring data between the first core and second core and an outside, the first core and the second core are connected to a common bus and the first core is set to have a higher operating frequency than the second core, the first core, the second core and the input/output circuit include MISFETs, respectively, and a first threshold of the MISFET constituting the first core is set to be smaller than a second threshold of the MISFET constituting the second core, and the first threshold and the second threshold are set to be smaller than a third threshold of the MISFET constituting the input/output circuit.

DETAILED DESCRIPTION OF THE PREFERRED EMBODIMENTS

Figure 1:
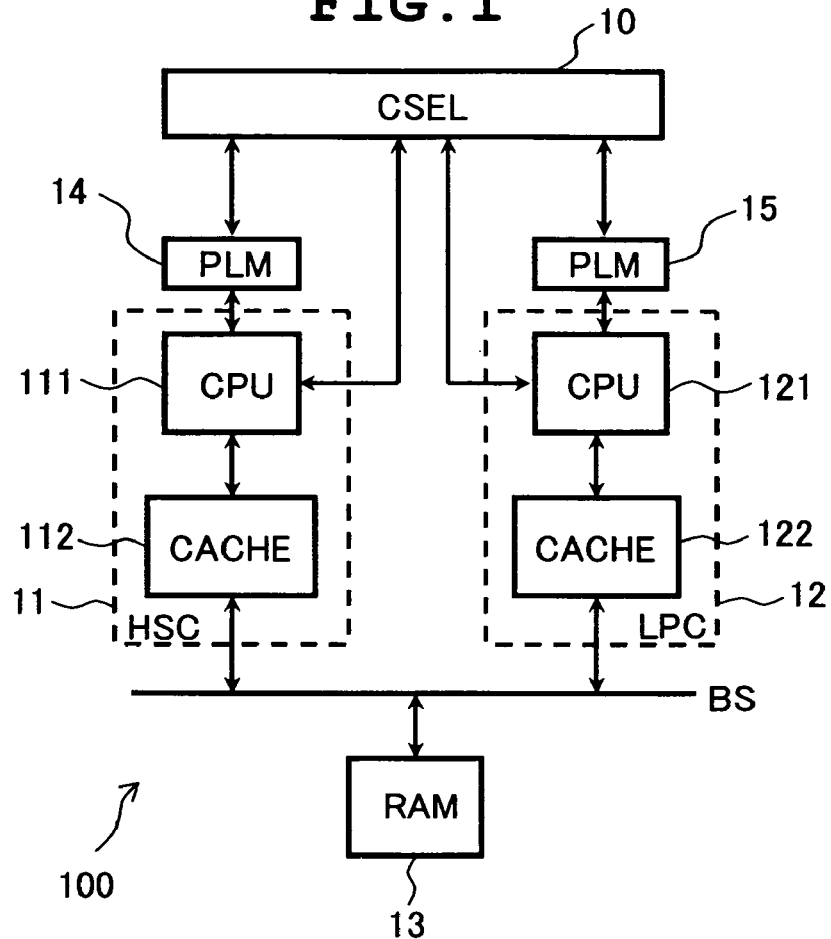
FIG. 1 is a block diagram showing an example of a structure of a microprocessor according to an example of a semiconductor integrated circuit in accordance with the invention.

FIG. 1 shows a microprocessor according to an example of a semiconductor integrated circuit in accordance with the invention.

A microprocessor 100 shown in FIG. 1 is not particularly restricted but is formed on a semiconductor substrate such as a single crystal silicon substrate by a well-known semiconductor integrated circuit manufacturing technique. The microprocessor 100 has at least two CPU cores, and therefore, is referred to as a multicore. More specifically, the microprocessor 100 includes a high speed processor core (HSC) 11 capable of carrying out a high speed operation and a low power processor core (LPC) 12 capable of carrying out an operation at a low speed and a low power, and information processing is executed by these two cores. The high speed processor core 11 includes a central processing unit (CPU) 111 for a calculation processing and a cache memory (CACHE) 112 for temporarily storing an instruction and data which have high utilization frequencies. Moreover, the low speed processor core 12 includes a central processing unit (CPU) 121 for a calculation processing and a cache memory (CACHE) 122 for temporarily storing an instruction and data which have high utilization frequencies. Power control circuit (PLMs) 14 and 15 for a power control are provided corresponding to the processors 11 and 12. The power control circuits 14 and 15 have the function of reducing a consumed power by the corresponding CPUs 111 and 121 and are constituted to include a clock gating circuit and a power switch as will be described below in detail. The high speed processor core 11 and the low power processor core 12 are constituted to include a plurality of MISFETs, respectively. At this time, the MISFET constituting the high speed processor core 11 and the MISFET constituting the low power processor core 12 are characteristically different from each other. An MISFET having a large amount of a leakage current and capable of carrying out a high speed operation is applied to the high speed processor core 11 and an MISFET having a small amount of the leakage current and capable of carrying out only a low speed operation is applied to the low power processor core 12. These two cores 11 and 12 are not particularly restricted but are connected to a shared memory (RAM) 13 capable of giving random access through a common bus BS. Moreover, the two cores 11 and 12 can be switched by a core selecting portion (CSEL) 10. Such a structure has a so-called perfect multicore form and a program counter (PC) is provided in the CPUs 111 and 121. Consequently, it is possible to carry out a simultaneous operation of the high speed processor core 11 and the low power processor core 12. As a matter of course, it is also possible to selectively operate the CPU 111 and the CPU 121 through a mediation of the core selecting portion 10.

It is desirable that the high speed processor core 11 and the low power processor core 12 should be switched every task. Some tasks can fully carry out a processing at a low speed and others are to perform a high speed operation. Depending on the task, accordingly, it is determined whether the high speed processor core 11 or the low power processor core 12 is used. The high speed processor core 11 and the low power processor core 12 can execute an identical instruction set. Thus, the core to carry out the calculation processing is varied depending on the task. Consequently, it is possible to switch a calculating power and a consumed power on a chip level while carrying out a pretension for a software as if the calculation processing is performed by means of one processor core. As a result, it is possible to reduce the consumed power and to enhance a calculation processing speed.

The switching of the high speed processor core 11 and the low power processor core 12 is not particularly restricted but can be generally supposed to be managed and implemented by an OS (operating system). In general, the OS for controlling a multicore is controlled by assigning a program to individual cores on a unit of a task. Therefore, by giving, as an identification bit, necessary frequency information (for example, one bit for a high speed or a low speed is applicable) on a program basis, for example, it is possible to decide whether the bit is to be assigned to the high speed processor core 11 or the low power processor core 12 on a hardware basis by seeing the bit. A specific switching control can also be carried out interlockingly with frequency switching, for example. This can be implemented by adding necessary frequency information when dividing a program into tasks by the OS, for example. Alternatively, it is also possible to clarify the switching of a frequency on a program basis in a software. In the case in which an operation is to be carried out at a high speed corresponding to the frequency switching described on the software basis, thus, the high speed processor core 11 is selected. In the case in which a low speed is enough, moreover, it is preferable to execute the switching control on a hardware basis in the core selecting portion 10 in order to use the low power processor core 12. Consequently, it is possible to carry out a pretension as if a calculation processing is carried out by one processor based on an original program. Alternatively, it is also possible to clearly describe the switching of the core over a source program directly. Consequently, it is possible to obtain an effect that an optimized control can be executed at a low power in a program creating stage.

In the case in which the high speed processor core 11 and the low power processor core 12 are operated at the same time, generally, there is a problem of a coherency of a cache memory. It is preferably implemented by a snooping control between the cache memories 112 and 122. Alternatively, it is preferable to avoid the problem of the coherency by the awareness of a programmer. In order to omit a snooping function of the cache memory, it is preferable to mount a cache memory of a write through type, thereby maintaining the coherency through the shared memory 13.

On the other hand, in the case in which the high speed processor core 11 and the low power processor core 12 are not executed at the same time, it is also possible to maintain the coherency by saving the contents of the cache memories 112 and 122 in the shared memory 13 by a flashing operation. The cache memory 112 and the cache memory 122 may have different capacities from each other. Moreover, all of the high speed processor core 11, the low power processor core 12 and the shared memory 13 which are components may be constituted over an LSI monolithically or may be constituted as an SIP (System-in-a-Package) in various combinations.

Figure 2:
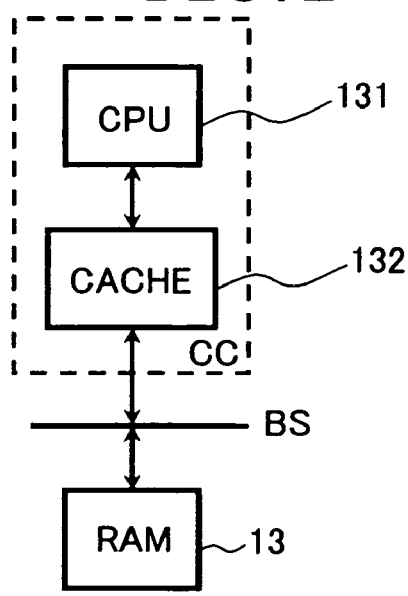
FIG. 2 is a block diagram showing an example of a structure of a microprocessor to be a comparing object of the microprocessor illustrated in FIG. 1.

FIG. 2 shows a circuit to be a comparing object of the semiconductor integrated circuit illustrated in FIG. 1.

A core (CC) has a CPU 131 and a cache memory 132 connected to the memory 13 through a bus (BS). In the case in which a high speed operation is to be executed with such a structure, a threshold of the MISFET and a thickness of the gate insulating film are regulated to carry out a design in such a manner that a leakage current of the LSI is included in a permitted upper limit. In such a design, it is hard to cause reduction in a leakage and the high speed operation to be consistent with each other over the whole LSI chip. The reason will be described with reference to FIG. 3

Figure 3:
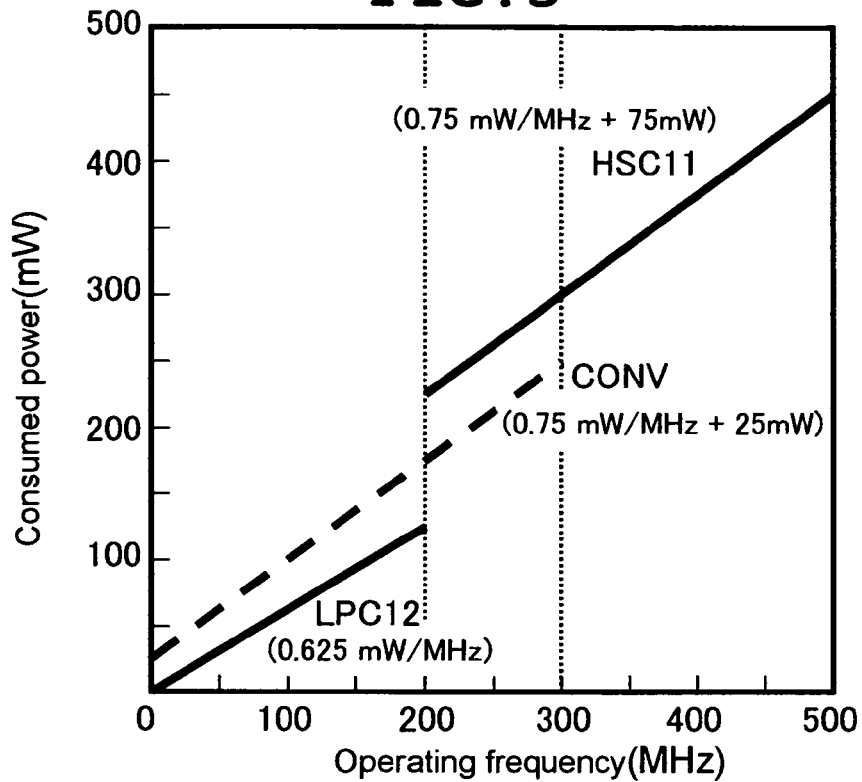
FIG. 3 is a characteristic chart showing a relationship between a consumed power and an operating frequency in a processor core illustrated in FIGS. 1 and 2.

FIG. 3 shows a relationship between a consumed power and an operating frequency in the processor core illustrated in FIGS. 1 and 2.

In the comparing object core (CC) shown in FIG. 2, for example, it is assumed that an operation at a maximum frequency of 300 MHz is implemented at 250 mW. In general, if a process at 130 nm or more is used, it is necessary to take countermeasures, for example, to reduce the threshold of the MISFET in order to implement the high speed operation. If such an MISFET is used, accordingly, the leakage current is increased. It is assumed that a power consumed by the leakage is 25 mW. In this case, a relationship between the operating frequency of the core (CC) and a consumed power P_conv is shown in the following equation (1):

$$P\_conv = 0.75 \text{ (mW/MHz)} \times f\text{(MHz)} + 25 \text{ (mW)} = P\_conva + P\_convl \quad (1)$$

wherein f represents an operating frequency and P_conva represents a switching power of the LSI which is a proportional component to the frequency. Moreover, P_convl represents a power depending on the leakage current of the MISFET which is independent of the frequency. In the case in which such a core (CC) is used, a relationship between a power and a frequency which is shown in a broken line of FIG. 3 is obtained. In the case in which the operating frequency may be low, accordingly, the power consumed by the leakage current is remarkable.

On the other hand, according to the structure shown in FIG. 1, the low power processor core (LPC) 12 is used for an execution if a low speed operation is enough, and the high power processor core (HSC) 11 is used for the execution if a high speed processing is required. Since the low power processor core (LPC) 12 does not require the high speed operation, it is constituted by the MISFET having a small amount of the leakage current and is characterized by a low operating speed and a low consumed power. On the other hand, the high speed processor core (HSC) 11 has a large amount of the leakage current and a high consumed power, and can correspondingly carry out a high speed operation. A relationship between a power and a frequency in the low power processor core 12 and the high speed processor core 11 is obtained as follows.

First of all, a power related equation of the low power processor core (LPC) 12 is expressed in (2):

$$P\_lp = 0.625 \text{ (mW/MHz)} \times f\text{(MHz)} = P\_lpa + P\_lpl \quad (2)$$

wherein f represents an operating frequency and P_lpa represents a switching power of the LSI. P_lpl represents a term depending on a leakage and does not depend on the frequency. The low power processor core 12 has a small power consumption caused by the leakage which can be disregarded. For this reason, a P_lpl component is set to be zero. This can be implemented by increasing the threshold of the MISFET, for example. In the case in which two thresholds are used to carry out a design, alternatively, it can be implemented by increasing the amount of use of the MISFET having a great threshold. If a restriction of a logical synthesis is loosened and the synthesis is thus performed on a slow condition, moreover, a power can be decreased by an effect that a cell for guaranteeing an internal timing can be reduced. Thus, the power can be reduced more greatly than a result of the synthesis on a boundary condition for demanding an execution of a higher speed operation.

Next, a power related equation of the high speed processor core (HSC) 11 is expressed in (3):

$$P\_hs = 0.75 \text{ (mW/MHz)} \times f\text{(MHz)} + 75 \text{ (mW)} = P\_hsa + P\_hsl \quad (3)$$

wherein f represents an operating frequency and P_hsa represents a switching power of the LSI. P_hsl represents a term depending on a leakage. The high speed processor core 11 can be implemented by reducing the threshold of the MISFET constituting the comparing object core (CC) in order to carry out an operation at a higher speed than the comparing object core (CC), for example. In the case in which two thresholds are used to carry out a design, alternatively, the high speed processor core 11 can be implemented by increasing an amount of use of an MISFET having a small threshold.

According to the example, it is possible to obtain the following functions and advantages.

(1) According to the structure shown in FIG. 1, it is possible to execute the calculation processing by selectively using the two cores 11 and 12 having operating speeds and power consuming amounts which are different from each other. When a low speed is enough depending on a task, therefore, the operation is carried out by using the low power processor core 12 and a control for cutting off the supply of a current through a power switch is carried out on the high speed processor core side as will be described below. Consequently, it is possible to reduce a power more greatly than that in the structure shown in FIG. 2. On the other hand, in the case in which a high speed operation is required depending on the task, the high speed processor core 11 is operated. Consequently, it is possible to obtain a high speed performance which cannot be implemented by the comparing object core (CC) and the low power processor core 12.

(2) The high speed processor core 11 and the low power processor core 12 can execute an identical instruction set. Consequently, the same program can be optionally executed in both the first processor and the second processor. By changing the processor cores 11 and 12 depending on the task, it is possible to carry out switching of a calculating power and that of a consumed power on a chip level while performing a pretension for a software as if the calculation processing is executed by means of one processor.

(3) In particular, the functions and advantages of (2) have been neither described nor suggested in the Patent Documents 1 to 3.

Figure 4:
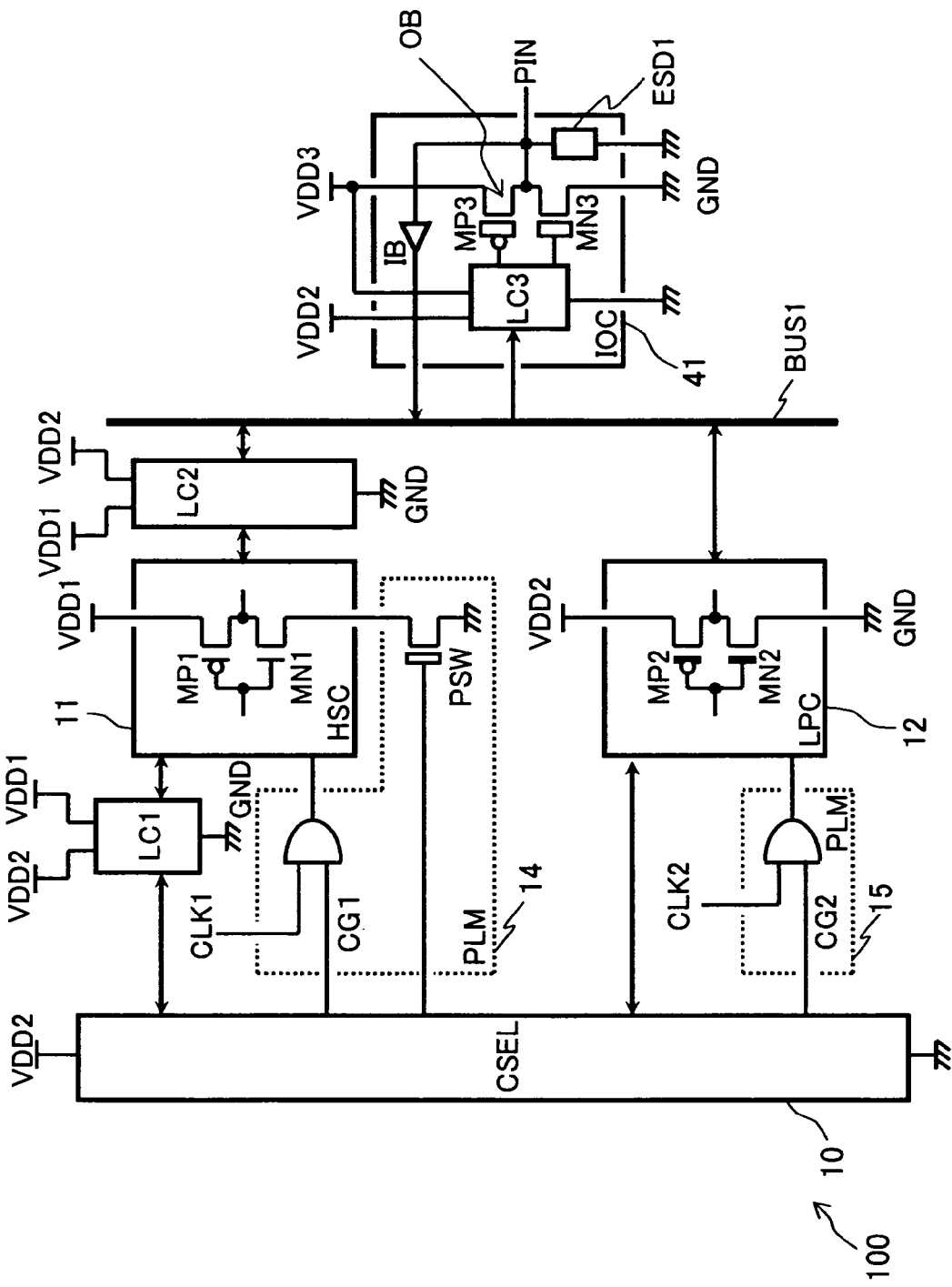
FIG. 4 is a block diagram showing another example of the structure of the microprocessor according to the example of the semiconductor integrated circuit in accordance with the invention.

FIG. 4 shows another example of the structure of the microprocessor according to the example of the semiconductor integrated circuit in accordance with the invention.

With the structure shown in FIG. 4, a high speed processor core (HSC) 11 and a low power processor core (LPC) 12 are provided and are coupled to an input/output circuit (IOC) 41 through a common bus BUS1 so that a signal can be transferred together with an outside of a chip.

A core selecting portion (CSEL) 10 for implementing a switching control of the high speed processor core 11 and the low power processor core 12 includes a clock gating mechanism for implementing a control of a supply of a clock to the cores 11 and 12 and a power cutoff control mechanism for controlling a supply of a power of the high speed processor core 11. The power cutoff control mechanism includes power control circuits (PLMs) 14 and 15 provided between the core selecting portion (CSEL) 10 and the cores 11 and 12. Referring to gating of the clock, gating of input clock signals CLK1 and CLK2 is executed in response to gating signals CG1 and CG2 sent from the CSEL 10. An AND gate is used for the gating, which is not particularly restricted. Moreover, a power cutoff mechanism is also provided for the power control circuit 14 and is executed by means of a power switch PSW. While a method for cutting off a ground (GND) side is employed in the structure shown in FIG. 4, a power supply VDD1 side may be disconnected or both the VDD1 and the ground (GND) may be disconnected. By providing, in the HSC core 11, a mechanism for holding a state set before cutting off the power supply at time of the cutoff of the power supply, it is possible to carry out a high speed return from the cutoff of the power supply, which is not shown. Moreover, it is also advantageous to the high speed return that information in the high speed processor core 11 is backuped to a power supply portion other than the high speed processor core 11.

In the example, an MISFET (MP1, MN1) constituting the high speed processor core 11, an MISFET (MP2, MN2) constituting the low power processor core 12, and an MISFET (MP3, MN3) constituting the input/output circuit 41 are constituted in different gate insulating film thicknesses. A thickness Tox1 of a gate insulating film of the high speed processor core is the smallest, a thickness Tox2 of a gate insulating film of the low speed processor core is, the second greatest and a thickness Tox3 of a gate insulating film constituting the input/output circuit 41 is the greatest. Referring to the thicknesses of the gate insulating films, for example, Tox1, Tox2 and Tox3 are approximately 1.4 nm, approximately 2 nm and 4 to 7 nm based on an equivalent gate insulating film thickness conversion in a 65 nm process, respectively. The thicknesses of the gate insulating films depend on magnitude of a source voltage to be applied, and the power supply VDD1 of the high speed processor core has a voltage of 0.9V to 1V, a power supply VDD2 of the low power processor core 11 has a voltage of 1.2 V, and a power supply VDD3 of the input/output circuit has a voltage of 1.8V to 3.3V, for example. Thus, an operation is carried out by using power supplies of a large number of types. For this reason, the high speed processor core 11 is provided with level converting circuits LC1, LC2 and LC3 for converting a signal amplitude level between the power control circuit 14 and the input/output circuit 41 as shown in FIG. 4.

The input/output circuit 41 includes the level converting circuit LC3, an output buffer OB for externally sending an output of the level converting circuit LC3, an input buffer (IB) for fetching data from an outside, and an electrostatic breakdown preventing circuit (ESD1) for protecting the MISFET from an electrostatic breakdown. The output buffer OB is constituted by a serial connection of the MISFET (MP3) and the MISFET (MN3). One terminal (PIN) is used for inputting/outputting a signal. The input/output may be assigned to separate terminals.

Next, description will be given to the reason why the high speed processor core 11, the low speed processor core 12 and the input/output circuit 41 are constituted by using the three thicknesses of the gate insulating films as described above.

By microfabrication of the process, generally, reduction in the thickness of the gate insulating film of the MISFET is executed. The reason is as follows. It is advantageous to an enhancement in the MISFET performance that an electric field of the MISFET is maintained to be constant and is thus scaled (constant electric field scaling) in order to reduce a size of the MISFET by the microfabrication of the process. In the case in which the constant electric field scaling is executed, thus, the reduction in the thickness of the insulating film of the MISFET is indispensable to the scaling of a source voltage supplied to the MISFET. When the source voltage and a component are scaled by the microfabrication of the process, thus, a drop in a gate capacity Cg and VDD and an ON-state current Idsi per MISFET constituting a circuit are almost invariable. Therefore, a switching speed (Tpd) of the MISFET is enhanced as shown in the following equation (4). Accordingly, an operation can be carried out at a higher speed.

$$Tpd \alpha (Cg \times VDD)/Idsi \quad (4)$$

By reduction in the source voltage which is caused by the microfabrication of the process, moreover, it is also possible to decrease a switching power of a transistor. The decrease is proportional to a square of the source voltage. Thus, a transistor having the process microfabricated has a high operating speed. By a comparison at an equal frequency, a power is generally reduced more greatly.

However, a leakage current of the MISFET which is caused by the microfabrication of the process has recently been remarkable and the amount of the leakage cannot be disregarded. First of all, when the source voltage is scaled, the ON-state current of the MISFET is shown in the following equation (5).

$$Ids \alpha (VDD - Vth)^\alpha \quad (5)$$

$\alpha$=approximately 1.4 is set. In the case in which Ids per unit length is set to be equal to or greater than that in the conventional art, therefore, it is necessary to reduce a threshold Vth. A reduction in the voltage by the threshold causes an increase in a subthreshold leakage current. Moreover, the reduction in the thickness of the gate insulating film of the MISFET also increases a gate tunnel leakage current, which has been described above. It has been known that these leakage currents will tend to be increased on an exponential function basis in the future. There is a tendency that a total power to be a sum of the leakage current and a switching current is increased.

Next, description will be given to the fact that a structure of the high speed processor core 11 through the MISFET having a large amount of a leakage current and operated at a high speed is effective for reducing a power in the high speed operation of the high speed processor core 11.

There will be considered the case in which a relationship between consumed power and an operating frequency of the high speed processor core 11 is expressed in the following equation (6), for example:

$$P\_hsl = 0.38 \text{ (mW/MHz)} \times f\text{(MHz)} + 150 \text{ (mW)} = P\_hsa1 + P\_hsl1 \quad (6)$$

wherein f represents an operating frequency and P_hsa1 represents a switching power of the LSI. The reason why P_hsa1 is lower than the switching power shown in FIG. 3 is that the effect of a reduction in a voltage is enhanced by the use of the microfabrication process. A 1.2V operation is assumed and estimated to be freely implemented by a 0.85V operation. Consequently, the effect for reducing a power is enhanced because the power is proportional to a square of the source voltage. On the other hand, P_hsl1 is a term depending on a leakage. The reason why P_hsl1 is greater than that in the high speed processor core (HSC) 11 shown in FIG. 3 is that an influence of the reduction in the thickness of the gate insulating film is increased together with the reduction in the voltage by the threshold. In the example, it is assumed that a sixfold voltage of the leakage power shown in FIG. 3 is assumed. If the high speed processor core (HSC) is constituted by the MISFET, a power for an operating frequency is very high in a low speed operation. In the case in which the operation is carried out at a high speed, however, the influence is alleviated so that an amount of an increase in the power is reduced. Consequently, it is possible to carry out the high speed operation at a lower power than that in the high speed processor core shown in FIG. 3.

On the other hand, it is unadvisable to use the MISFET having a large amount of the leakage current in a circuit which does not require an increase in an operating speed. The reason is that a rate of occupation of an unnecessary leakage current component for an actual calculation is increased in a power at a low frequency. Accordingly, it is desirable that a circuit to be operated at a low speed should be constituted by an MISFET having a great thickness of a gate insulating film, a high applied power VDD, a great threshold and a low leakage. For this reason, these circuits are designed by an MISFET having a high breakdown voltage. For this reason, the high speed processor core 11 and the low speed processor core 12 are constituted by MISFETs having different gate insulating film thicknesses. In the design of an LSI, moreover, it is also necessary to integrate a conventional chip on a board at an outside of the chip and to design an interface circuit at a source voltage which is the same as that in the conventional art. The voltage is higher than the source voltage used in the core. In general, it is hard to carry out the design by such an MISFET as to be used in the core in respect of a relationship with a breakdown voltage and a leakage current. Thus, an interface with a device having a high voltage (for example, 3.3 V) will be required for the outside of the LSI in the future. Therefore, it is necessary to constitute the input/output circuit 41 by an MISFET capable of applying a high voltage. For this reason, the input/output circuit 41 is constituted by the gate insulating films having three thicknesses in the example. By using the three gate insulating film thicknesses, thus, it is possible to implement an LSI having a higher performance and smaller consumed power.

Figure 5:
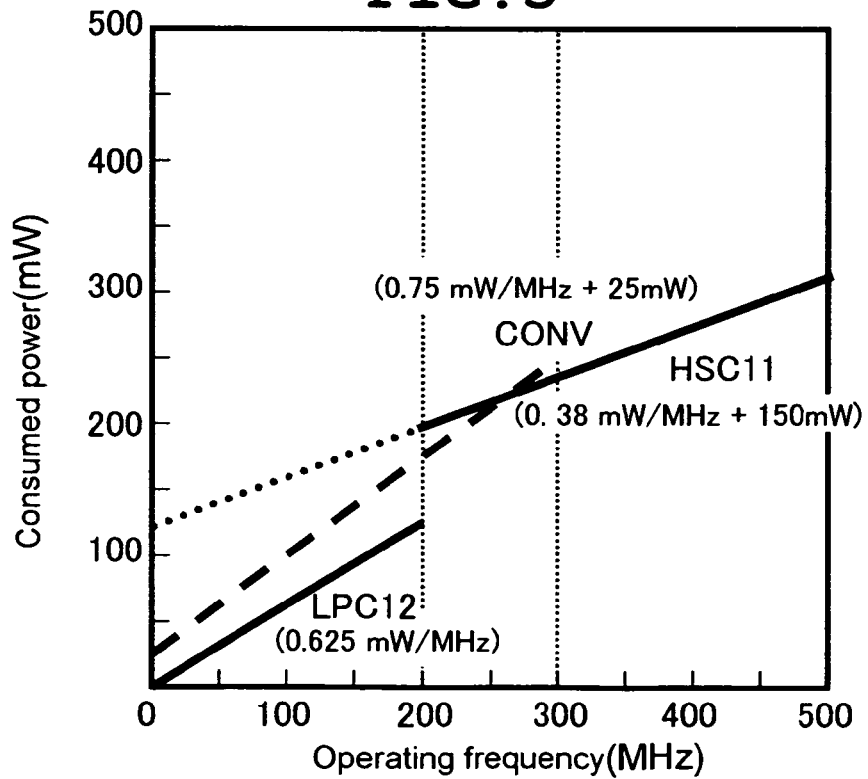
FIG. 5 is a characteristic chart showing a relationship between a consumed power and a frequency in the case in which a gate insulating film of an MISFET has three thicknesses in the microprocessor illustrated in FIG. 4.

FIG. 5 schematically shows a relationship between a consumed power and a frequency in the case in which the MISFET have three gate insulating film thicknesses. FIG. 5 also shows a relationship (CONV) between an operating frequency and a consumed power with a structure using one MISFET. With the structure using one MISFET, a microfabrication and small Vth are required for obtaining a demand performance. For this reason, it is assumed that the relationship between the power and the frequency is given by the following equation (7) in consideration of 25 mW corresponding to a leakage current in the same manner as that shown in FIG. 3, for example.

$$P\_CONV=0.75 \text{ mW/MHz}+25 \text{ mW} \tag{7}$$

In the example, however, the design is carried out by using the high speed processor core 11 and the low power processor core 12. Therefore, it is possible to carry out an optimization by the high speed processor core 11 and the low power processor core 12. The low power processor core reduces an operating speed by using the MISFET in which a leakage can be almost disregarded in the same manner as in the case of FIG. 3. For example, a relationship between a power and a frequency is given as shown in the following equation (8).

$$P\_LPC=0.625 \text{ mW/MHz} \tag{8}$$

On the other hand, assuming that the high speed processor core 11 is constitute by an MISFET having a small gate insulating film thickness, a small threshold Vth and a high speed, 150 mW corresponding to a leakage current is added so that a relationship between a power and a frequency is given as shown in the following equation (9), for example.

$$P\_HPC=0.38 \text{ mW/MHz}+150 \text{ mW} \tag{9}$$

In the high speed processor core 11, the power supply is disconnected by the power switch PSW when it is unnecessary as shown in FIG. 4. When the high speed operation is not required, consequently, it is sufficient that the low power processor core 12 is operated. Thus, it is possible to obtain an advantage that considerable reduction in a power can be implemented, a decrease in power can be implemented more greatly than that in the conventional art, and a high speed performance which cannot be achieved in the conventional art can be obtained if necessary.

Figure 6:
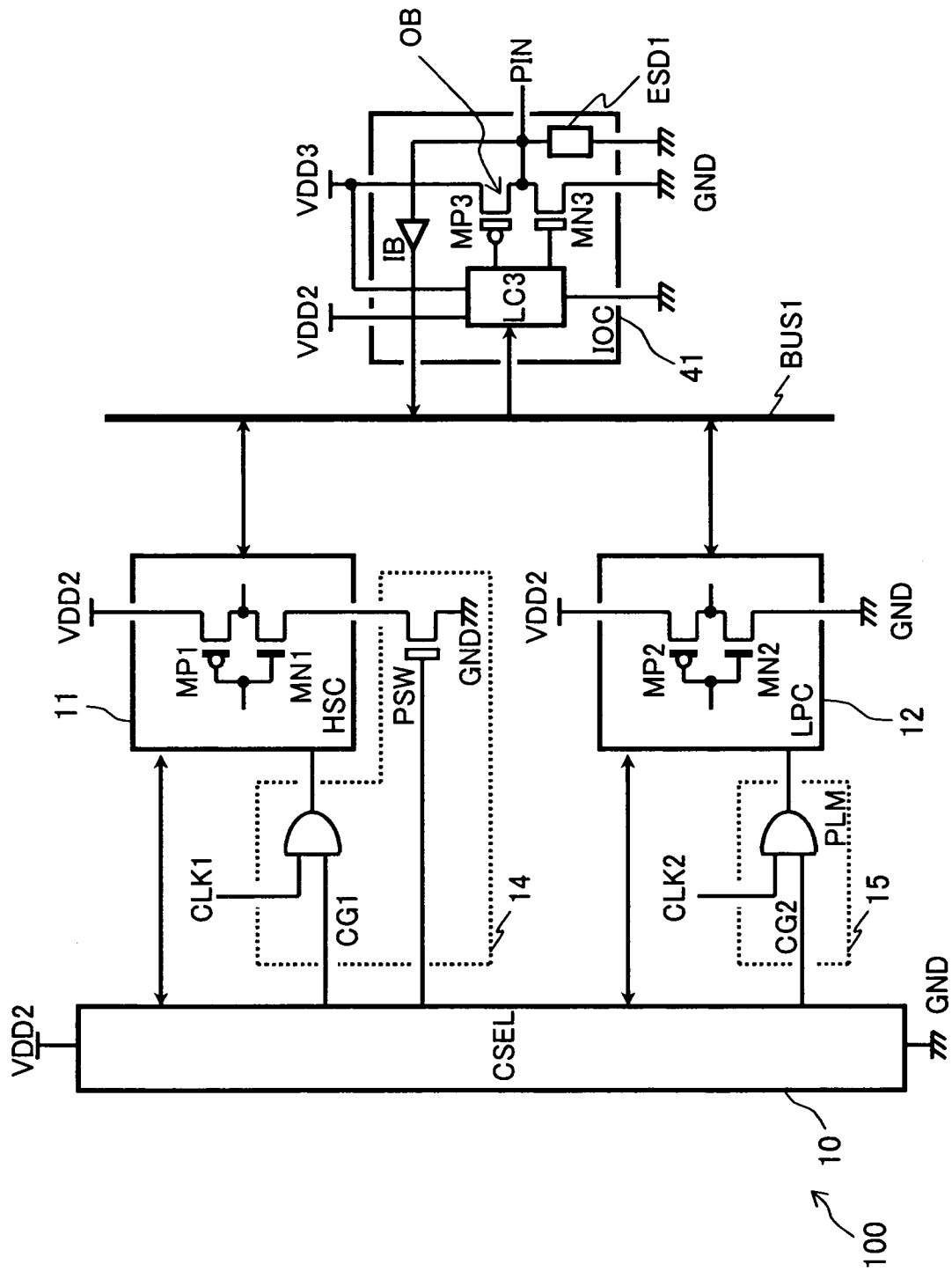
FIG. 6 is a block diagram showing a further example of the structure of the microprocessor according to the example of the semiconductor integrated circuit in accordance with the invention.

FIG. 6 shows a further example of the structure of the microprocessor according to the example of the semiconductor integrated circuit in accordance with the invention. In the example, the microprocessor shown in FIG. 6 is greatly different from that shown in FIG. 4 in that source voltages of a high speed process core HSC and a lower power processor core LPC are set to be equal to each other and operating powers of a core switching circuit CSEL and a bus BUS1 are set to be equal to each other, and a level converting circuit is thus omitted.

In the example, a high speed processor core 11 and a low power processor core 12 are constituted by the same gate insulating film thicknesses and two gate insulating film thicknesses together with an MISFET forming an input/output circuit 41. In the example, a threshold of the MISFET constituting the high speed processor core 11 is smaller than that of the MISFET constituting the low power processor core 12 and a ratio of the threshold of the MISFET constituting the high speed processor core 11 is different from that of the threshold of the MISFET constituting the low power processor core 12. A structural ratio of the MISFET having a small threshold in the high speed processor core 11 is higher than that in the low speed processor core 12.

In the example, source voltages of the high speed processor core 11 and the low power processor core 12 are equal to each other and operating power supplies of a core selecting portion 10 and the bus BUS1 are also the same. In the example, therefore, it is not necessary to provide a level converting circuit between the core selecting portion 10 and the high speed processor core 11 and between the high speed processor core 11 and the low power processor core 12, unlike the case shown in FIG. 4.

Next, description will be given to operations of the high speed processor core 11 and the low power processor core 12.

Figure 7:
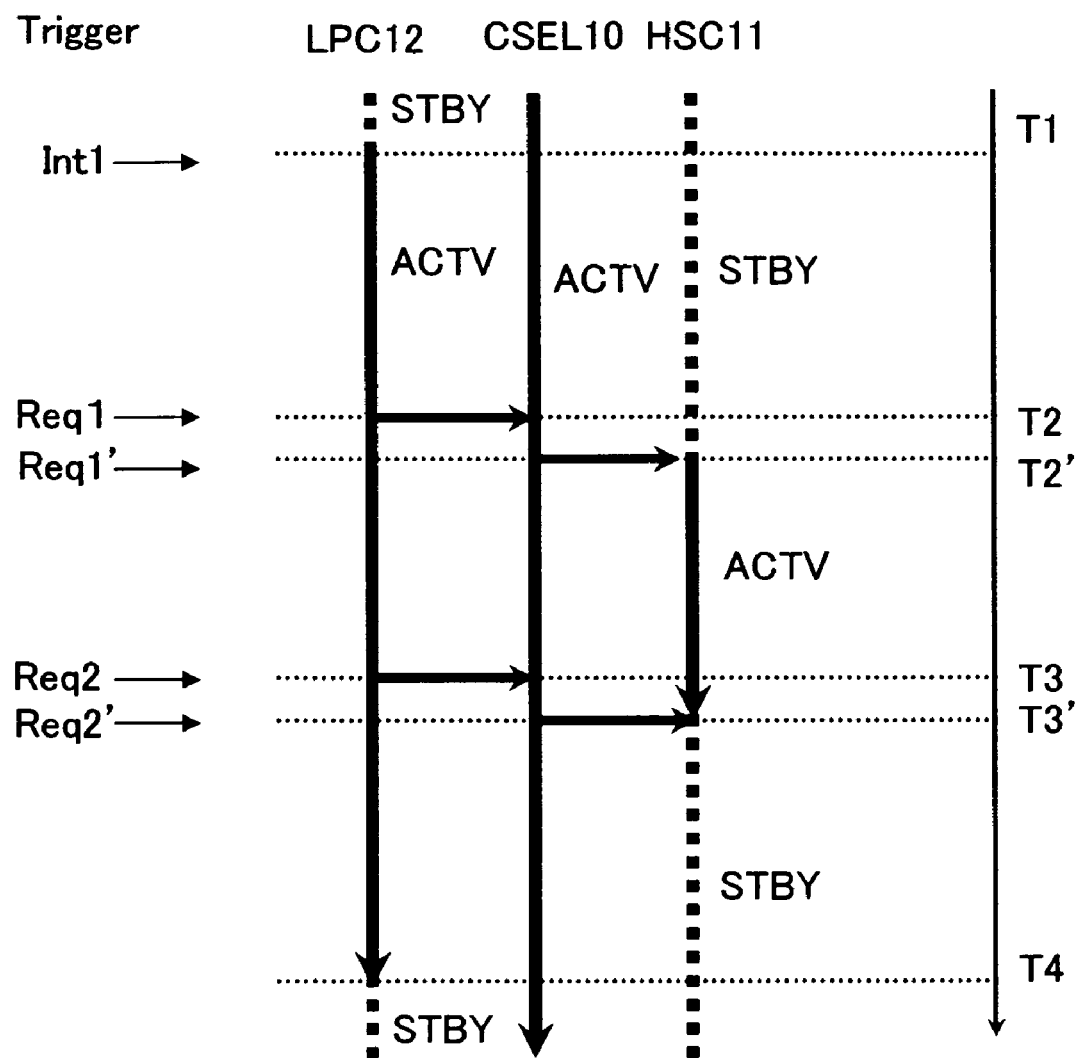
FIG. 7 is an operation timing chart for a high speed processor core, and a low power processor core and a core selecting portion in the microprocessor illustrated in FIG. 6.

FIG. 7 shows operation timings of the high speed processor core 11, the low power processor core 12 and the core selecting portion 10.

A time transition is shown from a top toward a bottom of FIG. 7, and there are illustrated active states (solid line) and standby states (broken line) for the low power processor core 12, the core selecting portion 10 and the high speed processor core 11.

Description will be given to the case in which the two cores 11 and 12 can be operated at the same time.

When an interrupt signal Int1 is generated at a time T1, the low power processor, core 12 maintained in the standby state (for example, a state in which clock gating is executed) starts an operation and a predetermined processing is carried out, and a starting request signal (Req1) of the high speed processor core 11 is then transmitted to the core selecting portion 10 based on the interrupt signal at a time T2. The high speed processor core 11 has a large amount of a leakage current. Therefore, the standby state indicates a power cut-off state. At a time T2', the core selecting portion 10 transmits, to the HSC, a signal (Req1') for setting the HSC into the active state upon receipt of the signal, and a power switch is turned on and the clock gating is released to supply a clock signal, thereby setting the high speed processor core 11 into the active state. In this case, it is preferable to first execute a control for turning on the power switch to start the high speed processor core 11 over a PLM1 and to then execute a control for starting the high speed processor core 11 itself. In the case in which the high speed operation of the high speed processor core 11 is not required, thereafter, a signal (Req22) for demanding a stoppage of the high speed processor core 11 is input to the core selecting portion 10 and the low power processor core 12 issues a stop signal (Req22') of the high speed processor core 11 to the high speed processor core 11 to execute the clock gating and to carry out a power cutoff control when the power cutoff is required. FIG. 7 shows that the power cutoff is executed to return into the standby mode because a period for which the high speed processor core 11 is unnecessary is maintained continuously for a while after a time T3. Then, the operation of the low power processor core 12 is also unnecessary at a time T4. Therefore, a standby mode is started to reduce a power.

Figure 8:
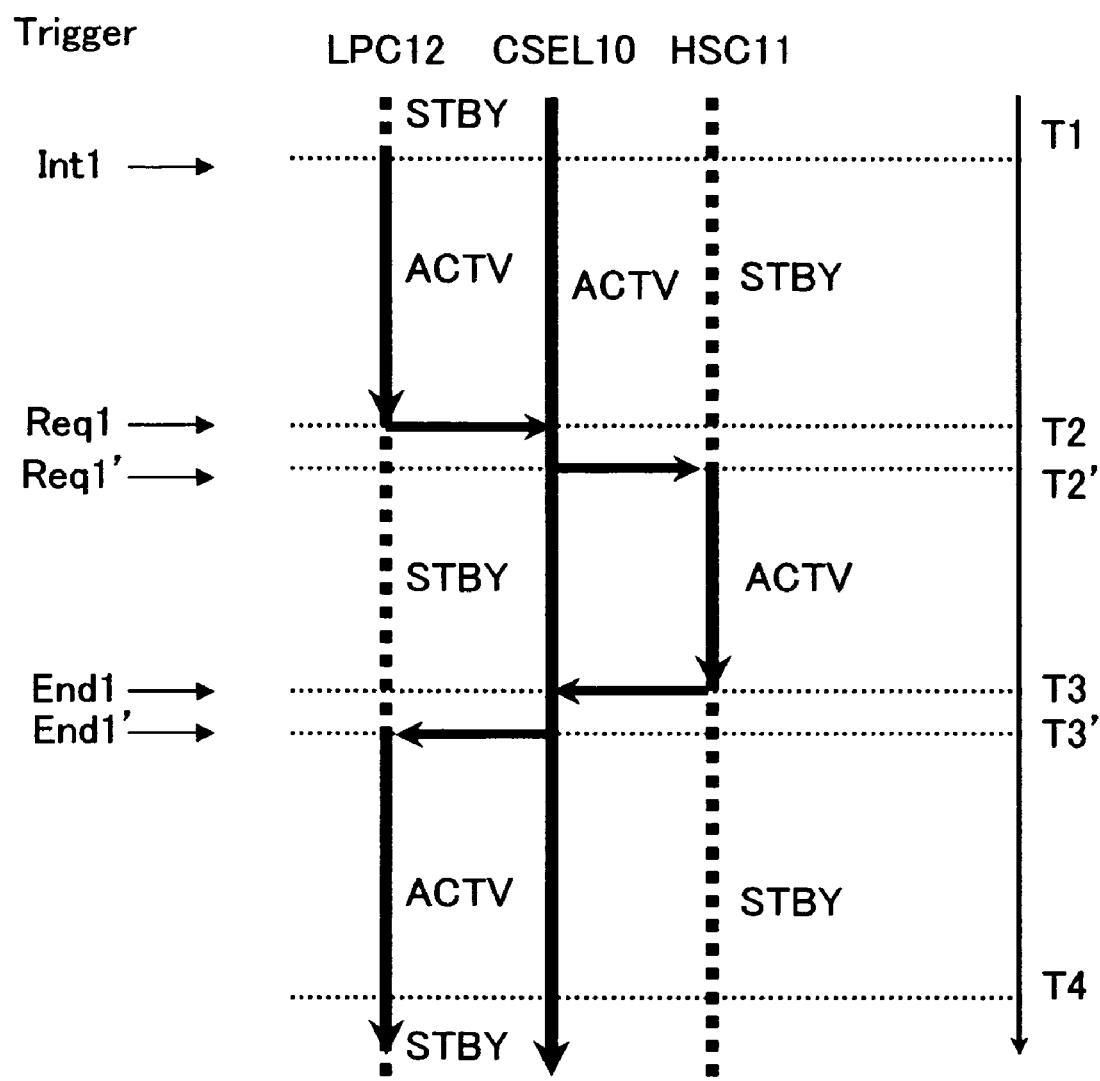
FIG. 8 is an operation timing chart in the case in which the high speed processor core and the low power processor core are not operated at the same time.

FIG. 8 shows an example of a control in the case in which the high speed processor core 11 and the low power processor core 12 are not operated at the same time.

When the interrupt signal Int1 is generated at the time T1, the low power processor core 12 maintained in the standby state starts the operation and a predetermined processing is carried out, and the starting request signal (Req1) of the high speed processor core 11 is then transmitted to the core selecting portion 10 based on the interrupt signal at the time T2 and the low power processor core 12 itself enters the standby mode. At this time, the low power processor core 12 executes the clock gating. At the time T2', the core selecting portion 10 transmits, to the high speed processor core 11, the signal (Req1') for setting the high speed processor core 11 into the active state upon receipt of the signal, and the power switch is turned on and the clock gating is released to supply a clock signal, thereby setting the high speed processor core 11 into the active state. The low power processor core 12 tries to be set into the standby state with the clock gating executed. However, this assumes that the leakage current of the low power processor core 12 has a level which can be disregarded. If the leakage current of the low power processor core 12 does not have the level which can be disregarded, it is preferable to provide a power switch in the low power processor core 12, thereby executing the power cutoff. In the case in which the operation of the high speed processor core 11 is ended, then, the high speed processor core 11 stands by in the standby mode, and furthermore, a processing end signal (End1) is input to the core selecting portion 10. FIG. 8 shows that the power cutoff is executed to return into the standby mode because a period in which the high speed processor core 11 is unnecessary for a while is maintained continuously after T3. The low power processor core 12 issues a processing end signal (End1') of the high speed processor core 11 to the low power processor core 12. The low power processor core 12 inputting End1' receives the supply of a clock and is thus recovered from the standby state. The high speed processor core 11 automatically enters the standby mode after the end of the operation, and at the same time, a notice of a processing end is given to the core selecting portion 10. Even if the high speed processor core 11 does not autonomously enter the processing standby mode, however, a control may be carried out in such a manner that the core selecting portion 10 receives an operation end signal from the high speed processor core 11 and then stops the high speed processor core 11.

Figure 9:
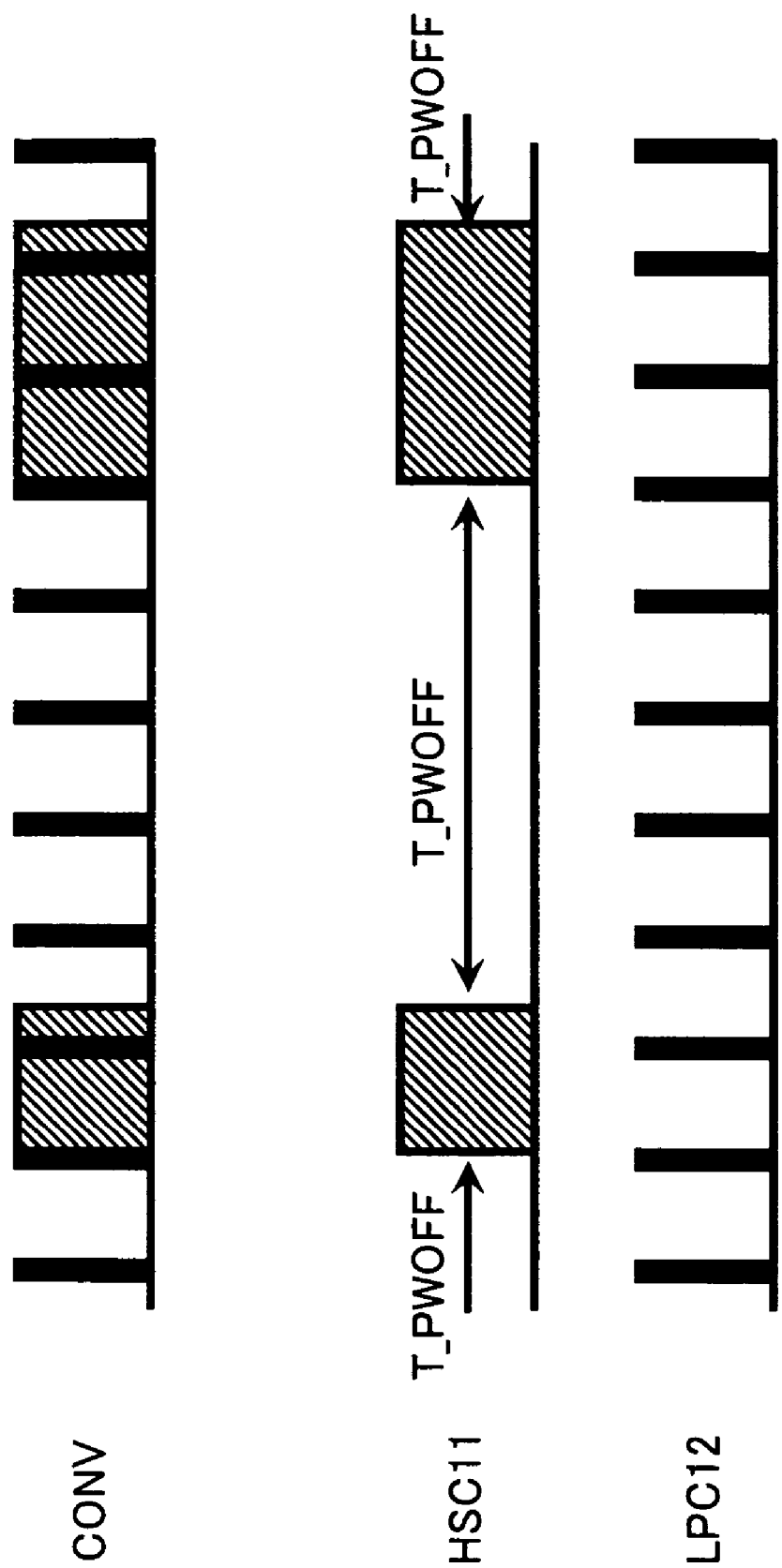
FIG. 9 is an explanatory diagram showing the case in which two processings are executed at the same time by one processor core and the case in which the two processings are shared by the high speed processor core and the low power processor core.

FIG. 9 shows an executing situation of a processing and a control situation of a power supply in the case in which two processings are executed at the same time by one processor core (CONV) and the case in which the processings are shared by the high speed processor core 11 and the low power processor core 12. It can be supposed that the processing is executed in the case in which there are executed a task to be a very light processing for intermittently executing an operation in a real time, for example, an intermittent standby mode of a cell phone and a task for executing a data processing at a high speed, for example, a three-dimensional graphics drawing processing.

In the case in which the two processings are executed by one core, a power cutoff control is not effectively executed and an amount of a power consumption caused by a leakage is increased even if a power cutoff mechanism is provided as in the case in which an interval between intermittent operations is short. The reason is that a power required for turning ON/OFF the power switch is predominant and the meaning itself of the power cutoff is thinned if the power supply is not cut of at a certain time interval.

On the other hand, in the case in which the operation is shared by the high speed processor core 11 and the low power processor core 12, it is possible to assign, to separate CPUs, a task processing of an intermittent operation which is light and a task for giving a request for a high speed operation which is a heavy processing. More specifically, the task having a light processing is assigned to the low power processor core 12 and the task having a heavy processing is assigned to the high speed processor core 11. As described above, the low power processor core 12 is constituted by a device in which a leakage can be disregarded, and the high speed processor core 11 is constituted by a device having a large amount of a leakage current and capable of carrying out a high speed operation. Therefore, a mean power of the low power processor core 12 has no leakage current part by a task distribution. Consequently, it is possible to reduce the consumed power. In addition, the high speed processor core 11 can carry out the power cutoff control when the operation is unnecessary, and furthermore, a period for the power cutoff can be prolonged. Thus, it is possible to implement reduction in a consumed power by the power cutoff while implementing necessary high speed performance. According to the example, therefore, it is possible to reduce the consumed power of a whole system.

Figure 10:
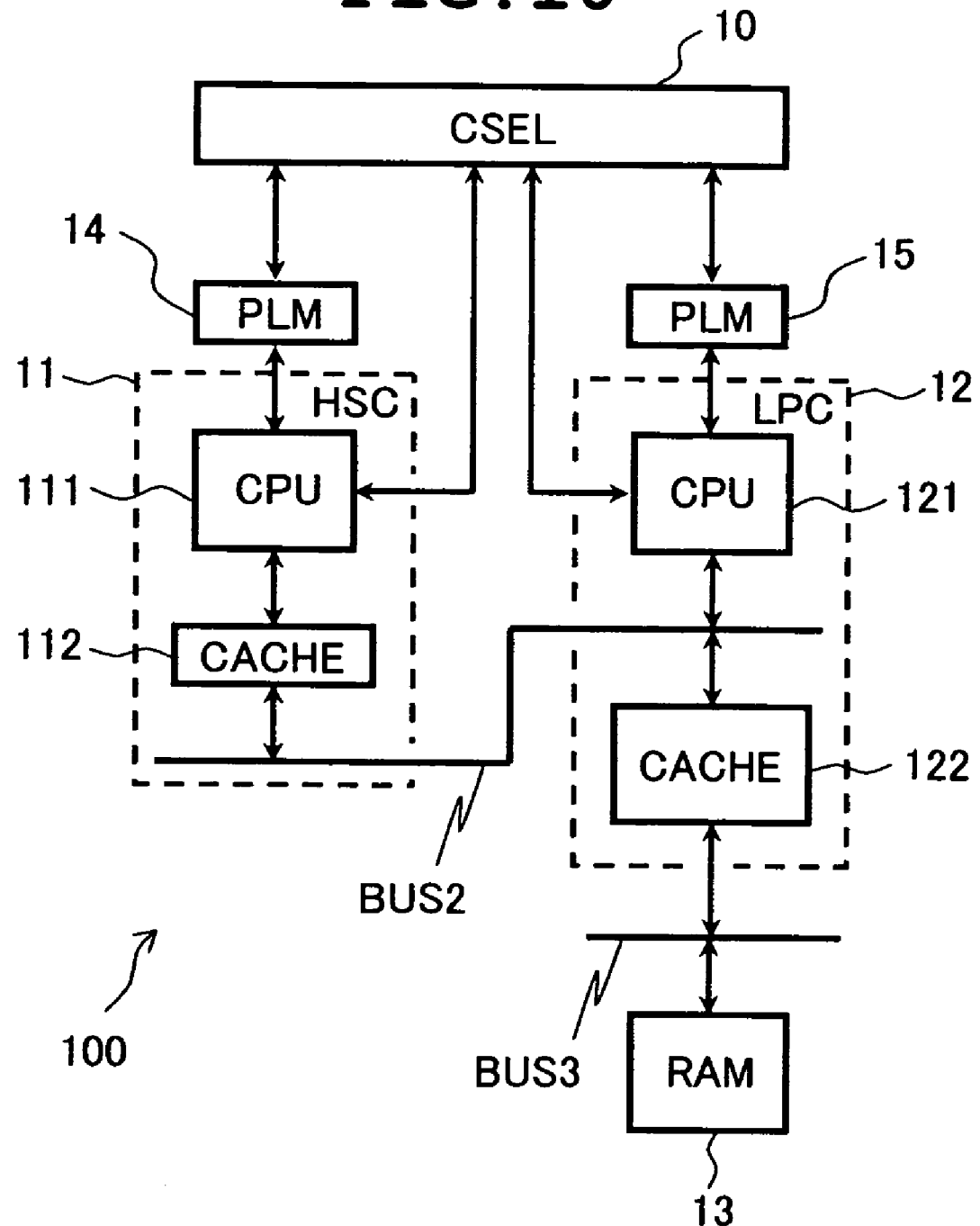
FIG. 10 is a block diagram showing a further example of the structure of the microprocessor according to the example of the semiconductor integrated circuit in accordance with the invention.

FIG. 10 shows a further example of the structure of the microprocessor according to the example of the semiconductor integrated circuit in accordance with the invention.

A microprocessor 100 shown in FIG. 10 is greatly different from that shown in FIG. 1 in that a cache memory 122 is shared by a high speed processor core 11 and a low power processor core 12. In the example, the high speed processor core 11 and the low power processor core 12 do not have symmetrical logic structures. Although a design is complicated, therefore, it is possible to obtain an advantage that a problem of a coherency of the cache memory 122 can be solved. As a method of solving the problem of the cache coherency, the cache memory 122 is connected through a bus BUS2 for connecting the high speed processor core 11 to the low power processor core 12 so that the cache memory 122 can be accessed equally from CPUs 1 and 2. In this case, it is assumed that the cache memory 122 is constituted by an MISFET having a low leakage in the same manner as the low power processor core 12 and an operating speed thereof is low. Therefore, a cache memory 112 is mounted in the high speed processor core 11 to compensate a deterioration in the operating speed. The cache memory 112 is set to be a cache memory of a write through type. Consequently, data of the cache memory 112 always have a copy in the cache memory 122. Thus, a coherency of the cache data is maintained by the CPUs 1 and 2.

Figure 11:
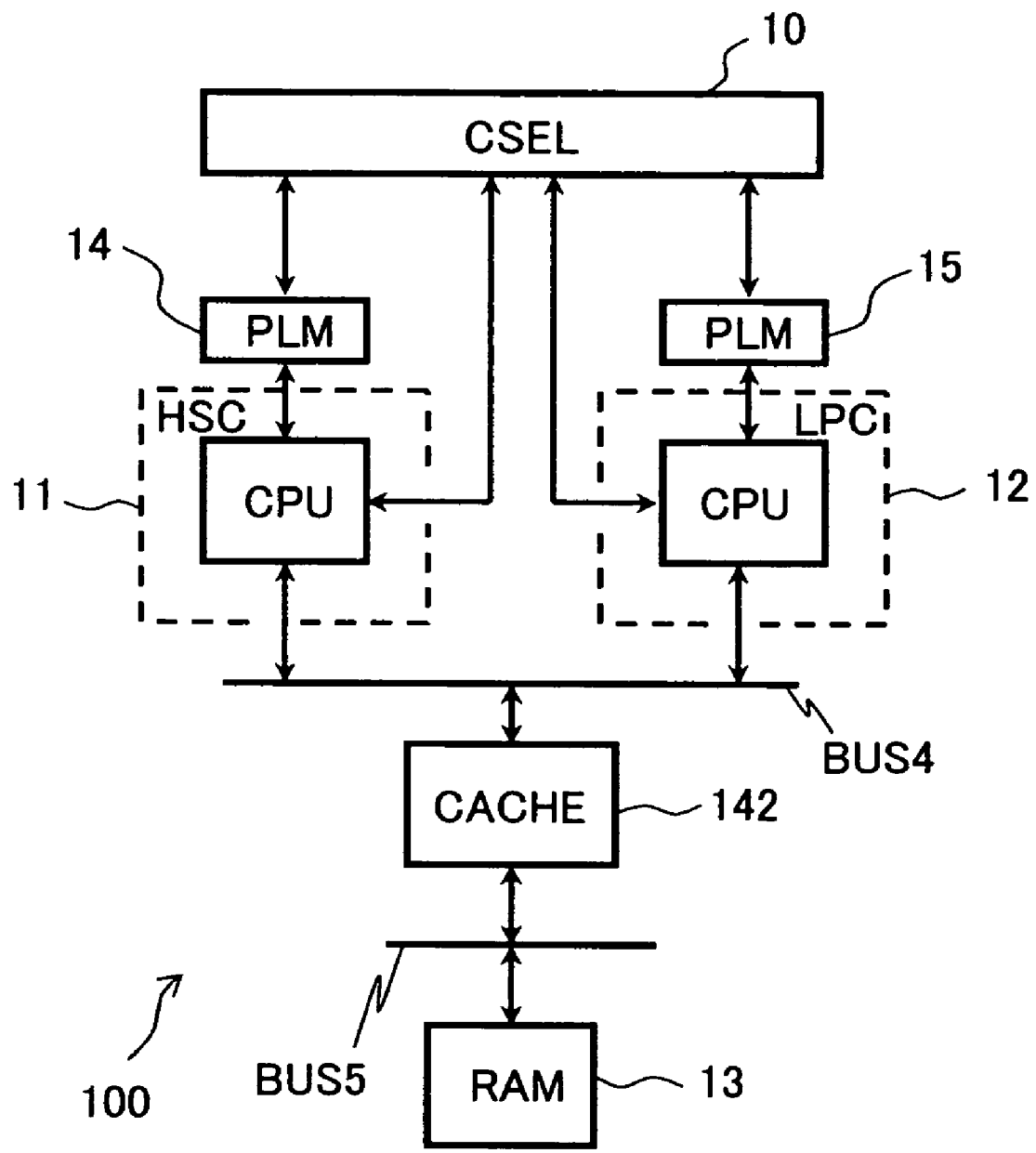
FIG. 11 is a block diagram showing a further example of the structure of the microprocessor according to the example of the semiconductor integrated circuit in accordance with the invention.

FIG. 11 shows a further example of the structure of the microprocessor according to the example of the semiconductor integrated circuit in accordance with the invention.

A microprocessor 100 shown in FIG. 11 is greatly different from that shown in FIG. 1 in that a high speed processor core 11 and a low power processor core 12 are connected to a common bus BUS4 and a cache memory 142 is shared by the high speed processor core 11 and the low power processor core 12. The cache memory 142 is connected to a shared memory 13 through a bus BUS5. In this case, a core selecting portion 10 selects a right for executing the cores 11 and 12. By employing such a structure, it is possible to easily maintain a coherency of the cache memory by the high speed processor core 11 and the low power processor core 12. In this case, how to set an operating speed of the cache memory 142 is important for a design. In order to exhibit processing performance of the high speed processor core 11 at a maximum, it is necessary to constitute the high speed processor core 11 by a high speed MISFET. Even if the cache memory 142 is provided with a power cutoff control mechanism, however, there is a possibility that an increase in a power might be caused by a leakage current because a use frequency thereof is very low. However, the coherency of the cache memory 142 can be maintained comparatively easily. Therefore, it is possible to obtain an advantage that a cost can be reduced.

Description will be given to the way of supplying power to the high speed processor core 11 and the low power processor core 12.

Figure 12:
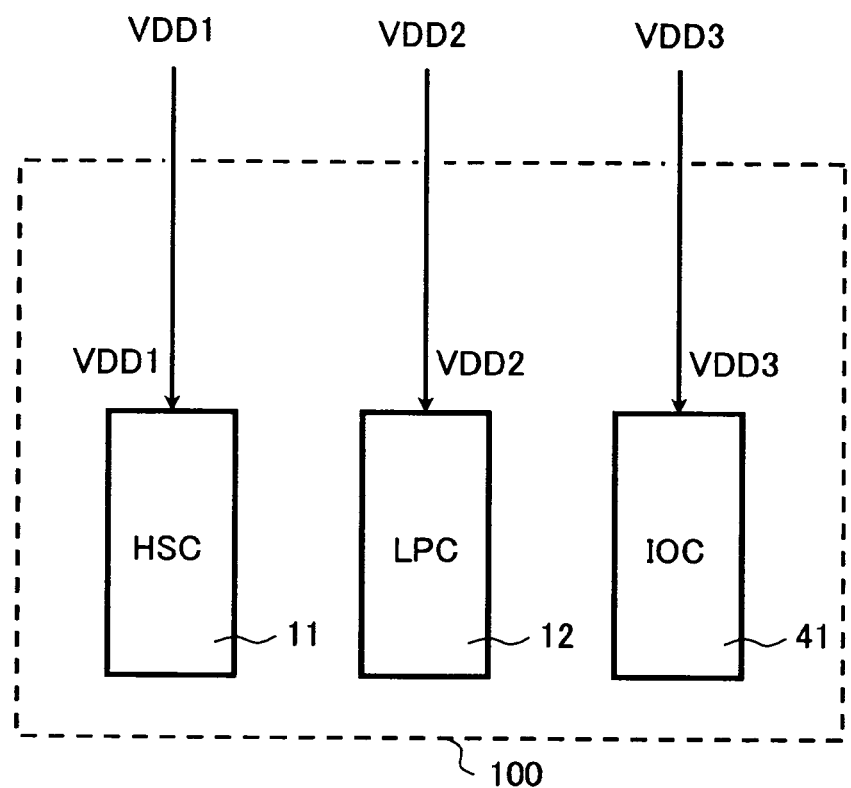
FIG. 12 is a block diagram showing a further example of the structure of the microprocessor according to the example of the semiconductor integrated circuit in accordance with the invention.

In an example shown in FIG. 12, a power VDD1 for the high speed processor core 11, a power VDD2 for the low power processor core 12 and a power VDD3 for an input/output circuit 41 are independently supplied from an outside of a chip in the microprocessor 100, respectively. In the case in which the powers are independently supplied respectively, thus, there is a defect that the number of components such as a pad for supplying power is increased and there is an advantage that stable power can be supplied from the outside of the chip. In this case, it is also possible to regulate a source voltage by transmitting voltage information to a power supply chip (a regulator chip) which is not shown. It is effective when the number of power supplies to be used is small.

However, the number of powers to be supplied is limited depending on an application used in an SoC in many cases. The reason is as follows. It is assumed that the number of terminals for a power supply is reduced to cut down a cost and a new power supply cannot be used because of a compatibility with a conventional system. Description will be given to the case in which the number of the powers to be supplied is thus limited.

Figure 13:
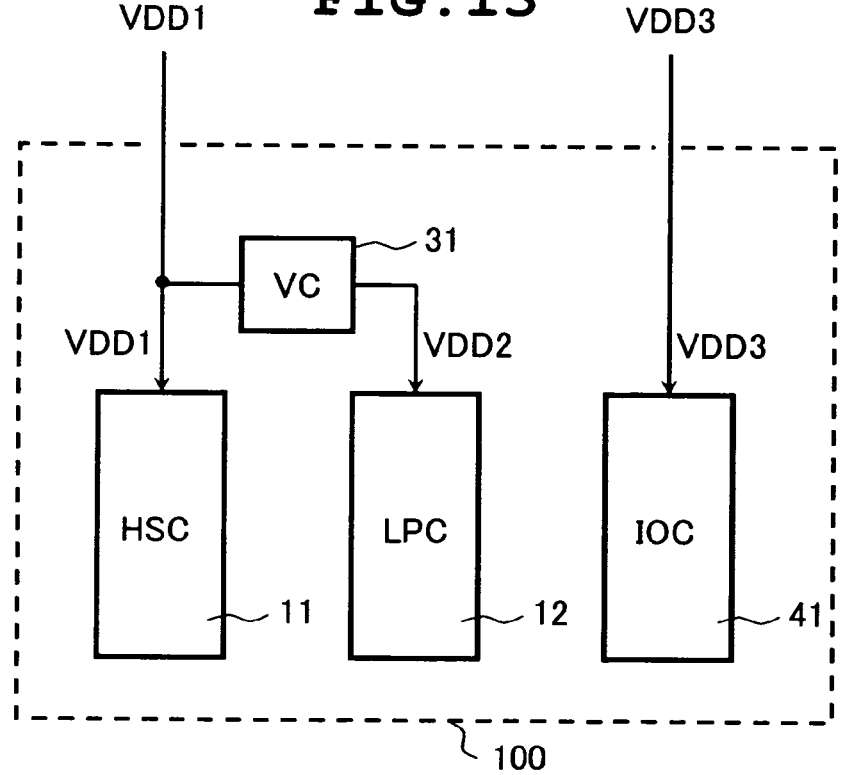
FIG. 13 is a block diagram showing a further example of the structure of the microprocessor according to the example of the semiconductor integrated circuit in accordance with the invention.

In an example shown in FIG. 13, a power VDD1 for a high speed processor core 11 and a power VDD3 for an input/output circuit 41 are independently supplied from an outside of a chip in a microprocessor 100, and a power VDD2 for a low speed processor core 12 is generated from the power VDD1 for the high speed processor core 11. A difference in a voltage between the powers VDD1 and VDD2 generally has a relationship of VDD1<VDD2 in the case in which a high performance MISFET having a small gate insulating film thickness is used as an MISFET for the high speed processor core 11 in the same manner as the case of the structure shown in FIG. 4. In such a case, therefore, VDD1 is boosted by a voltage regulating circuit (VC) 31 in order to generate the power VDD2. It is preferable to utilize a charge pump in order to raise a voltage. In the case in which a potential difference between the powers VDD1 and VDD2 is small, there is a defect that an efficiency of the generation of a voltage is deteriorated and the structure of the circuit is complicated. Since the number of the powers to be supplied from the outside of the chip can be reduced, however, there is an advantage that a cost can be cut down, for example, the number of power pads can be decreased. As the effect of mounting an on-chip power generating circuit, thus, a mechanism for compensating for a variation in a process can easily be mounted. In some cases in which a chip manufactured to have a little greater average: threshold due to the variation in a process is found at a step of inspecting an LSI, it is possible to avoid a deterioration in an operation by setting an output voltage of the voltage regulating circuit 31 to be a little higher. For the setting, it is possible to propose a method of writing a control bit to a control register in the voltage regulating circuit 31 on a software basis and a method of switching a trimming voltage by a fuse. Thus, it is possible to ship, as a good product, such a chip as to be conventionally selected as a defective product which has not reached an operating speed. Consequently, it is possible to enhance a yield.

Figure 14:
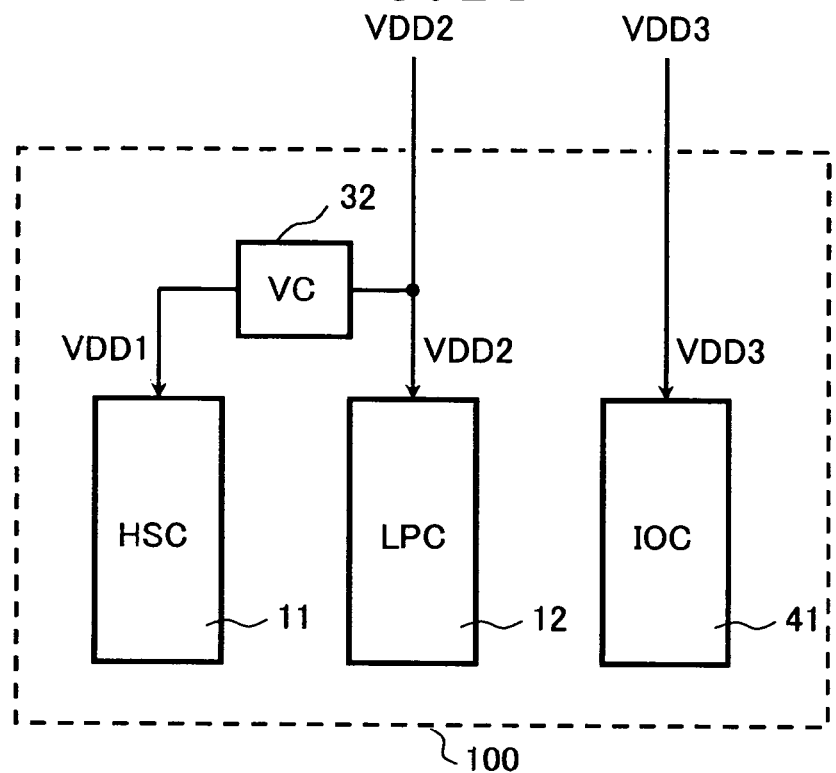
FIG. 14 is a block diagram showing a further example of the structure of the microprocessor according to the example of the semiconductor integrated circuit in accordance with the invention.

In an example shown in FIG. 14, a power VDD2 for a low power processor core 12 and a power VDD3 for an input/output circuit 41 are supplied independently from an outside of a chip in a microprocessor 100, and a power VDD1 for a high speed processor core 11 is generated from the power VDD2 for the low power processor core 12. A difference in a voltage between VDD1 and VDD2 generally has a relationship of VDD1<VDD2 in the case in which a high performance MISFET having a small gate insulating film thickness is used as an MISFET for the high speed processor core 11 in the same manner as in the case of the structure shown in FIG. 4. For this reason, it is sufficient that a voltage of the power VDD2 is dropped in a voltage regulating circuit 32 in order to generate VDD1. For the drop in the voltage, a regulator circuit can be applied. The regulator circuit includes a series regulator and a switching regulator. In the former, a power converting efficiency is low and a resistor is enough for a passive element so that mounting can easily be carried out. In the latter, a large number of passive elements such as a capacitance and an inductor are required and a high mounting cost is required but a power efficiency is high. It is preferable to determine a selection of either of them in consideration of a cost of the chip and a demand performance. In the case in which a potential difference between the powers VDD1 and VDD2 is small, there is a defect that an efficiency in the generation of a voltage is deteriorated and the structure of the circuit is complicated. On the other hand, it is possible to reduce the number of powers to be supplied from the outside of the chip. Consequently, the cost can be cut down, for example, the number of power pads can be decreased. Also in the example, it is possible to enhance a yield by providing a process variation compensating function in a voltage generating circuit.

Figure 15:
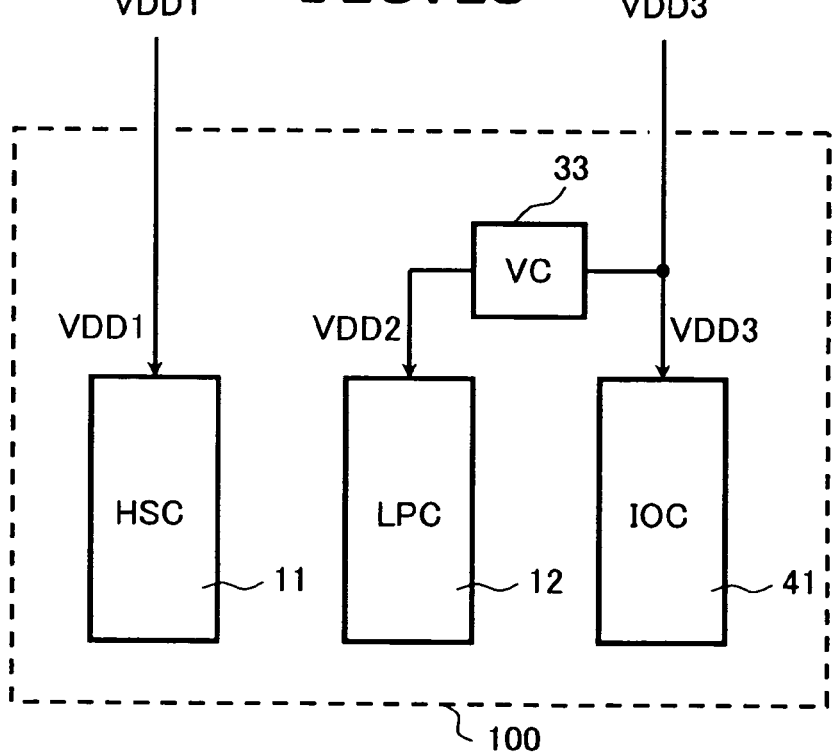
FIG. 15 is a block diagram showing a further example of the structure of the microprocessor according to the example of the semiconductor integrated circuit in accordance with the invention.

In an example shown in FIG. 15, a power VDD1 for a high speed processor core 11 and a power VDD3 for an input/output circuit 41 are supplied from an outside of a chip in a microprocessor 100. In the method, VDD2 having the smallest power consumption in the chip is constituted in the chip. The power for the input/output circuit 41 has a higher voltage than the other powers VDD1 and VDD2. Therefore, the voltage of the power VDD3 is dropped by a voltage dropping circuit (DC) 33 to form the power VDD2. In the example, the invention is also effective for the case in which a potential difference between VDD1 and VDD2 is small and it is hard to generate VDD1 from VDD2. In many cases, moreover, an on-chip regulator has a low power efficiency. However, a consumed current of VDD2 is small. Therefore, the efficiency of the regulator does not matter.

Figure 16:
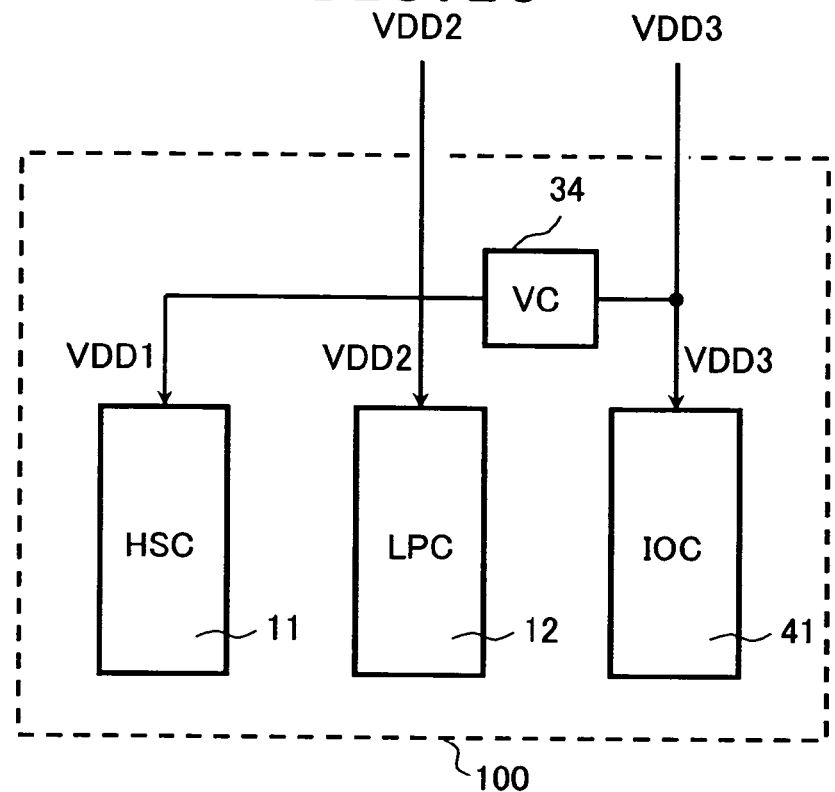
FIG. 16 is a block diagram showing a further example of the structure of the microprocessor according to the example of the semiconductor integrated circuit in accordance with the invention.

In an example shown in FIG. 16, a power VDD2 for a low power processor core 12 and a power VDD 3 for an input/output circuit 41 are supplied from an outside of a chip in a microprocessor 100. In this case, VDD1 having a large power consumption in the chip is constituted in the chip. The power VDD3 for the input/output circuit 41 is higher than the powers VDD1 and VDD2 of the cores. Therefore, the voltage of the power VDD3 is dropped by a voltage regulating circuit (VC) 34 to form VDD1. In the example, the invention is effective for the case in which a potential difference between the powers VDD1 and VDD2 is small and it is hard to generate VDD1 from VDD2. In many cases, moreover, an on-chip regulator has a low power efficiency. However, an efficiency of the regulator does not matter in the case in which a consumed current of the power VDD1 is smaller than that of the power VDD2, for example, a region of the high speed processor core 11 is reduced. In addition, there is an advantage that a yield can be enhanced by providing a process variation compensating function.

Figure 17:
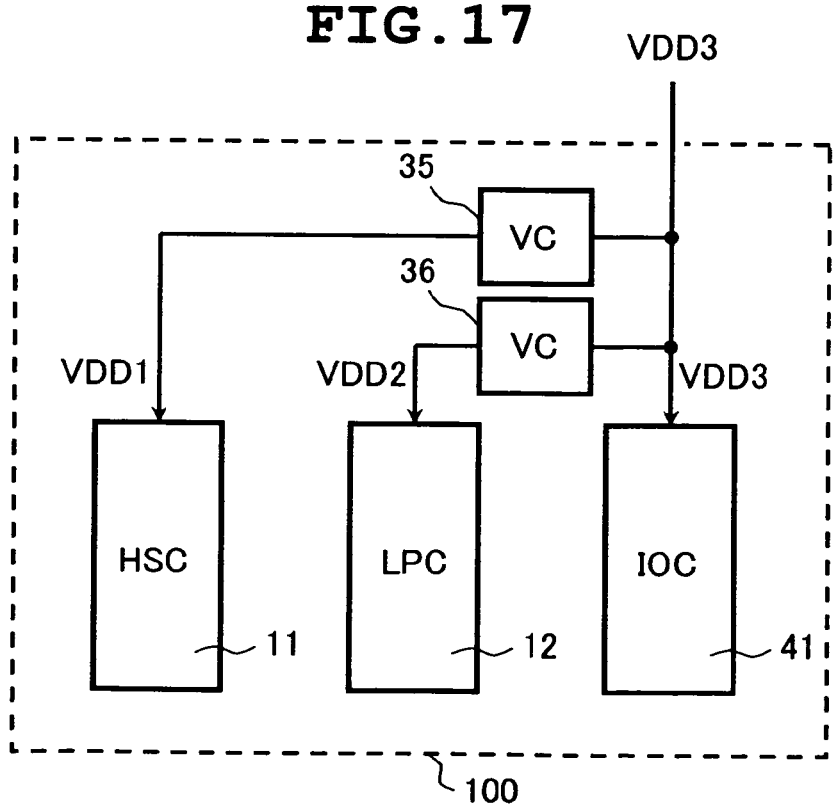
FIG. 17 is a block diagram showing a further example of the structure of the microprocessor according to the example of the semiconductor integrated circuit in accordance with the invention.

In an example shown in FIG. 17, only a power VDD3 is supplied from an outside of a chip. In this case, powers VDD1 and VDD2 to be used in the chip are formed in the chip. Consequently, the number of power pads can be reduced and the invention can be easily applicable to a product on which strict power restrictions are imposed when an LSI is to be constituted. A power for an input/output circuit 41 generally has a higher voltage than the powers VDD1 and VDD2 of the cores. Therefore, the voltage of VDD3 is dropped by a voltage regulating circuit (VC) 35 to form VDD1 and the voltage of VDD3 is dropped by a voltage regulating circuit 36 to form VDD2. In the example, the invention is effective for the case in which a potential difference between VDD1 and VDD2 is small and it is hard to generate VDD1 from VDD2. In many cases, moreover, an on-chip regulator has low power efficiency. However, an efficiency of the regulator does not matter in the case in which a consumed current of VDD1 is smaller than that of VDD2, for example, a region of the high speed processor core 11 is reduced. In addition, there is an advantage that a yield can be enhanced by providing a process variation compensating function.

Figure 18:
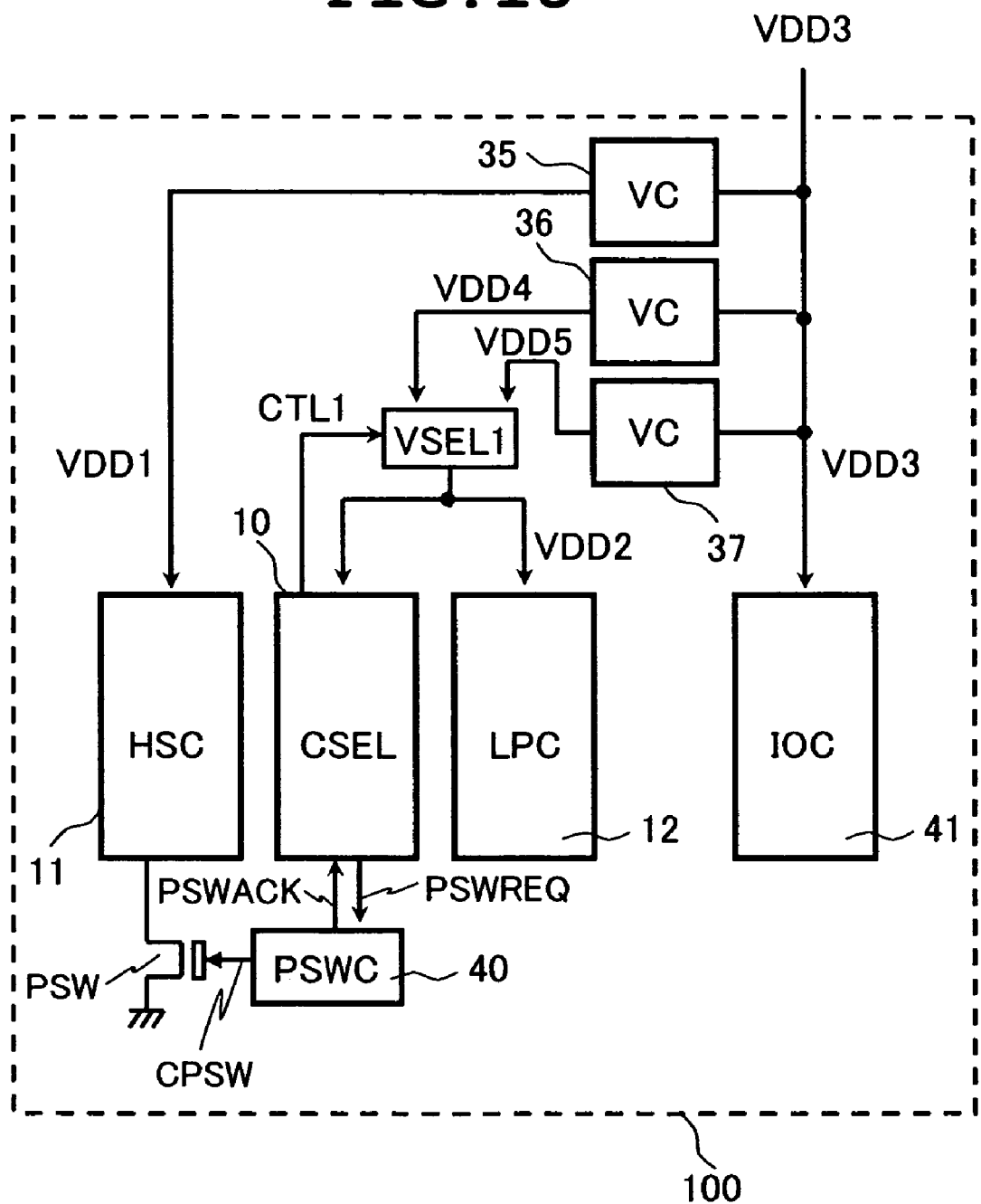
FIG. 18 is a block diagram showing a further example of the structure of the microprocessor according to the example of the semiconductor integrated circuit in accordance with the invention.

FIG. 18 shows an example of a structure in the case in which a power switch and a voltage regulator are integrated.

It is desirable that a power switch controller (PSWC) 40 for controlling a power switch PSW should be constituted by a thick film MOSFET, and VDD3 is used for a power to be applied Voltage regulating circuits (VCs) 35 and 36 are supposed to be regulators of a switching type which have a high power efficiency in a voltage conversion, and a voltage regulating circuit (VC) 37 is set to be a regulator of a series type in which a power efficiency in the voltage conversion is not very high and a voltage responding performance is high. A power VDD4 is formed by the voltage regulating circuit 36 and a power VDD5 is formed by the voltage regulating circuit 37. Description will be given by using the case in which VDD4=VDD5 is set. It is also possible to carry out an operation on the condition of VDD5>VDD4.

While the case in which only VDD3 is applied as shown in FIG. 17 will be described by taking an example in which a high speed processor core 11 is provided with a power cutoff function in the example, the invention can also be applied to the cases shown in FIGS. 13 to 16.

It has been known that the power switch PSW causes a large current to flow in an ON operation. In order to reduce the current, the power switch PSW is controlled by the power switch controller 40. In some cases, a drop in a voltage of the power supply becomes a problem. Accordingly, it is supposed that a power noise is generated in a circuit block to which VDD2 is supplied in such a case. By using, for a voltage generating circuit, a regulator having a low efficiency and a high responsiveness to a fluctuation in the voltage, for example, a series regulator at this time, resistance to the power noise is increased so that reduction in system performance can be suppressed. Moreover, it is also possible to carry out a control in a relationship of VDD4<VDD5. In this case, a voltage margin can be ensured. Therefore, it is possible to further increase resistance to a deterioration in a speed which is caused by a drop in a voltage. In the case in which a period for turning ON the power switch PSW passes, it is possible to achieve reduction in a power of a system by carrying out an operation using a switching regulator having a high power efficiency.

While the description has been given to the execution of the control for the switching from the switching regulator to the series regulator for only the period in which the power switch PSW is ON, thus, it is also possible to always activate the switching regulator and to use the series regulator together when the power switch is turned ON. Consequently, a power consumed in the regulator is increased. However, there is an advantage that a complicated control with the switching of the regulator is not required. Also in the case in which the high speed processor core 11 is operated at a maximum operating speed, it is possible to obtain an advantage that resistance to a noise made on a power line of the low power processor core 12 which is caused by an increase in the consumed power of the high speed processor core 11 is enhanced by using the series regulator having a high current supply capability and a high responsiveness to a fluctuation in a voltage. For this purpose, it is preferable to execute the switching control through a control signal CTRL1 sent from a core selecting portion (CSEL) 10. Also in this case, the power consumed in the regulator is increased. By using the series regulator and the switching regulator at the same time, however, it is possible to simplify the regulator control.

Figure 19:
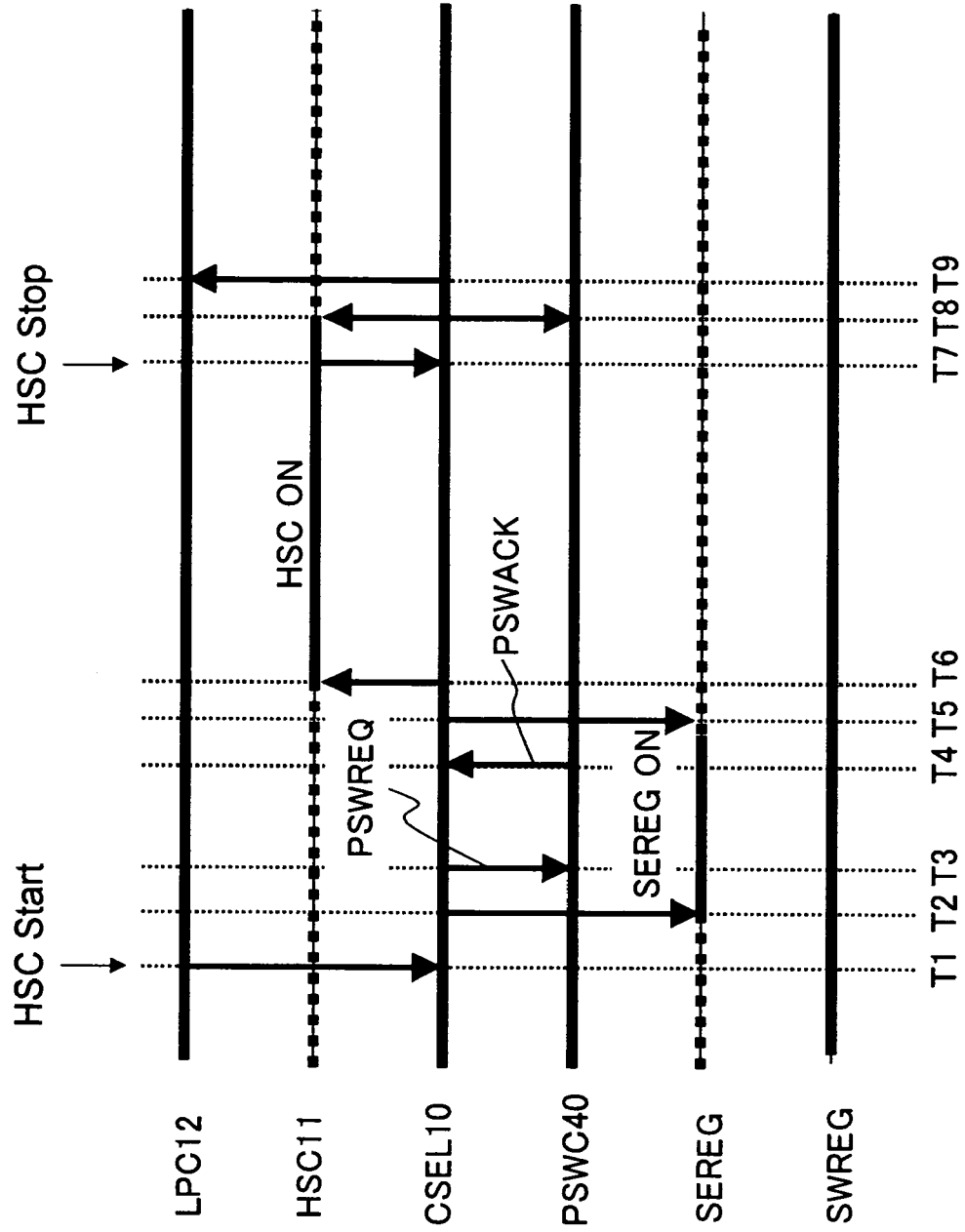
FIG. 19 is an operation timing chart in the case in which a power switch is to be turned ON in the microprocessor illustrated in FIG. 18.

FIG. 19 shows a timing of the regulator control in the ON-operation of the power switch PSW.

When a request for starting the high speed processor core 11 is given from an outside to the low power processor core 12 at a time T1, the low power processor core 12 transmits a signal for starting the high speed processor core 11 to the core selecting portion 10. The core selecting portion 10 transmits a control signal to start a series regulator SEREG at a time T2 upon receipt of the signal and switches power to be supplied to the low power processor core 12 into an output sent from the series regulator SEREG. Then, a control signal PSWCREQ is transmitted to the power switch controller 40 at a time T3. Upon receipt of the fact that the power switch PSW is completely turned ON, the power switch controller 40 outputs a PSWACK signal to the core selecting portion 10 at a time T4. The core selecting portion 10 can know that the power switch of the high speed processor core 11 is turned ON upon receipt of the PSWACK signal. Therefore, the stoppage of the series regulator SEREG is executed at a time T4 and the power supply to the low power processor core 12 is switched into an output sent from a switching regulator SWREG. At a time T6, moreover, the core selecting portion 10 transmits a starting signal of the high speed processor core 11 to the HSC 11 upon receipt of the PSWACK signal. Consequently, the high speed processor core 11 starts a calculation processing.

On the other hand, in the case in which the high speed processor core 11 is stopped, the high speed processor core 11 outputs a stop signal to the core selecting portion 10 at a time T7. At a time T8, then, the core selecting portion 10 outputs the stop signal of the high speed processor core 11 to the high speed processor core 11 and stops the high speed processor core 11, and furthermore, a request signal for cutting off a power to the power switch controller 40 is output. At a time T9, the core selecting portion 10 transmits the stoppage of the high speed processor core 11 to the low power processor core 12.

Figure 20:
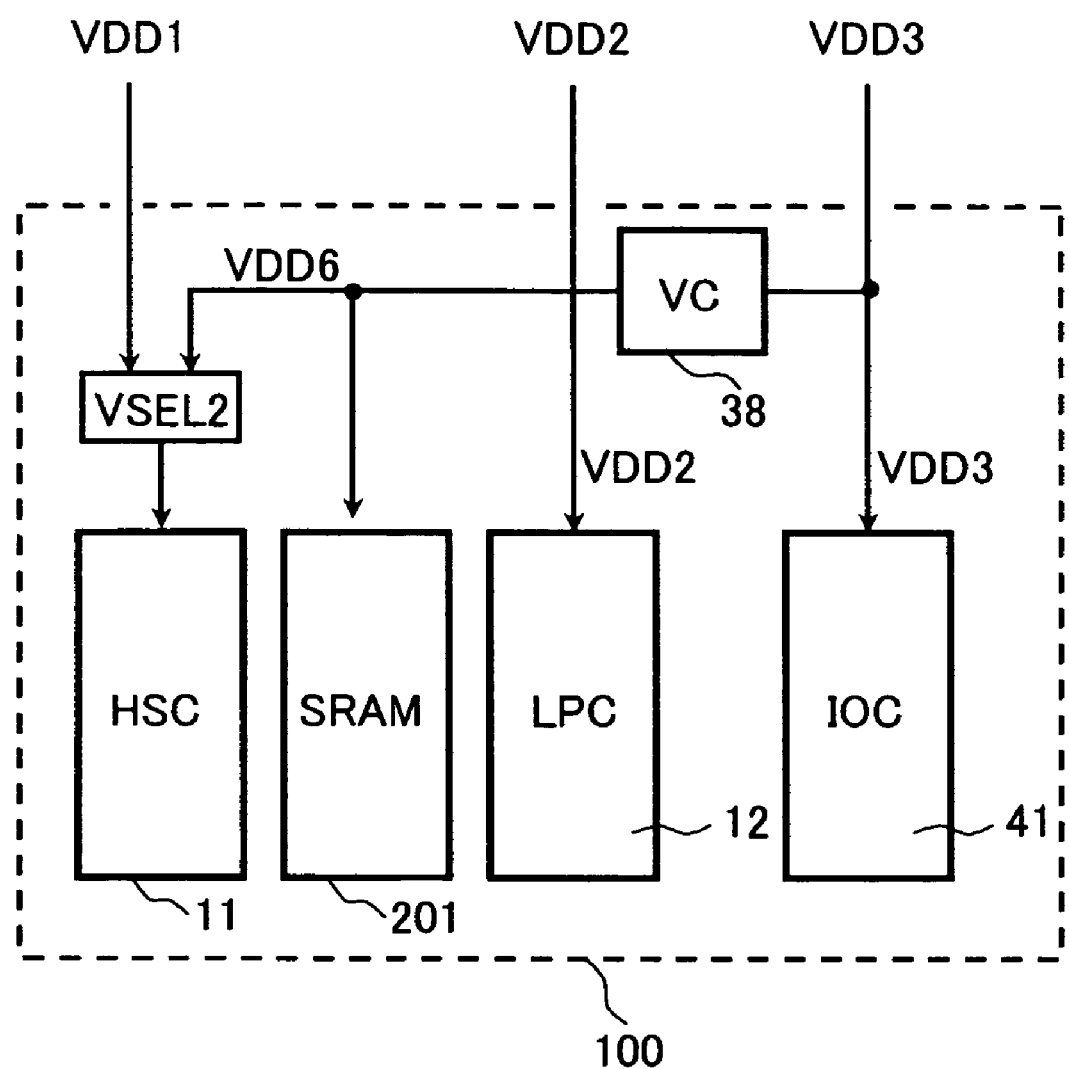
FIG. 20 is a block diagram showing a further example of the structure of the microprocessor according to the example of the semiconductor integrated circuit in accordance with the invention.

FIG. 20 shows a further example of the structure of the microprocessor according to the example of the semiconductor integrated circuit in accordance with the invention. In the example, power to be supplied to a high speed processor core 11 is switched into VDD1 and VDD4 and is thus applied. A relationship of VDD1<VDD4 is set. VDD1 is applied when an operation is to be carried out at a normal speed, and VDD4 is applied when a higher speed operation is required. The method is referred to as a dynamic voltage boost (DVB) method. In general, a source voltage and a frequency have a proportional relationship. By raising the source voltage, therefore, it is possible to implement a high speed operation. It is necessary to provide an upper limit on a voltage which can be applied. The reason is that a withstanding breakdown is caused if an excessively high voltage is applied to the MISFET constituting the high speed processor core 11.

Moreover, hot carrier resistance and TDDB (Time-Dependent-Dielectric-Breakdown) resistance are deteriorated due to the application of a high voltage. In order to prevent reliability from being damaged, accordingly, it is preferable to determine an upper limit voltage in such a manner that the side effect is not generated. In generally, a source voltage is defined with a certain range. For example, in the case in which 1.2 V is applied, a definition is given with a margin of 1.2 V±0.1 V in respect of specifications. Accordingly, a range of a voltage which can be applied is permitted between 1.1 V and 1.3 V, for example. It is preferable to carry out a design in such a manner that 1.3 V to be an upper limit voltage in respect of the specifications is thus applied to VDD4, for example. By such a design, it is possible to carry out a higher speed operation when a high speed operation is required. The voltage of the power VDD4 has such an advantage that a power supply is stabilized if power is always supplied to a circuit block requiring a high voltage. Such a circuit includes a memory mat of an SRAM, for example. In a memory cell of a static random access memory (SRAM) 201, generally, it has been known that an operation margin is decreased by a reduction in a voltage. In the example, however, a high voltage is supplied. Therefore, it is possible to increase the operation margin.

In the case in which a period for applying a maximum voltage is very limited in an actual using situation, moreover, it is also possible to apply 1.4 V to the power VDD4 in an LSI supposing the application of a voltage to be a breakdown upper limit on a device basis, for example, 1.2 V. In this case, it is necessary to limit a time taken for applying a high voltage is required for preventing the hot carrier resistance from being deteriorated unnecessarily. However, the operation can be carried out at a higher speed.

A voltage regulating circuit 38 is integrated on the LSI. Therefore, a voltage to be output from the voltage regulating circuit 38 can be determined comparatively freely. The voltage output from the voltage regulating circuit 38 can also be made programmable. Consequently, the function of compensating a process variation can be implemented. Moreover, a maximum frequency which is required can be implemented with a minimum power.

Figure 21:
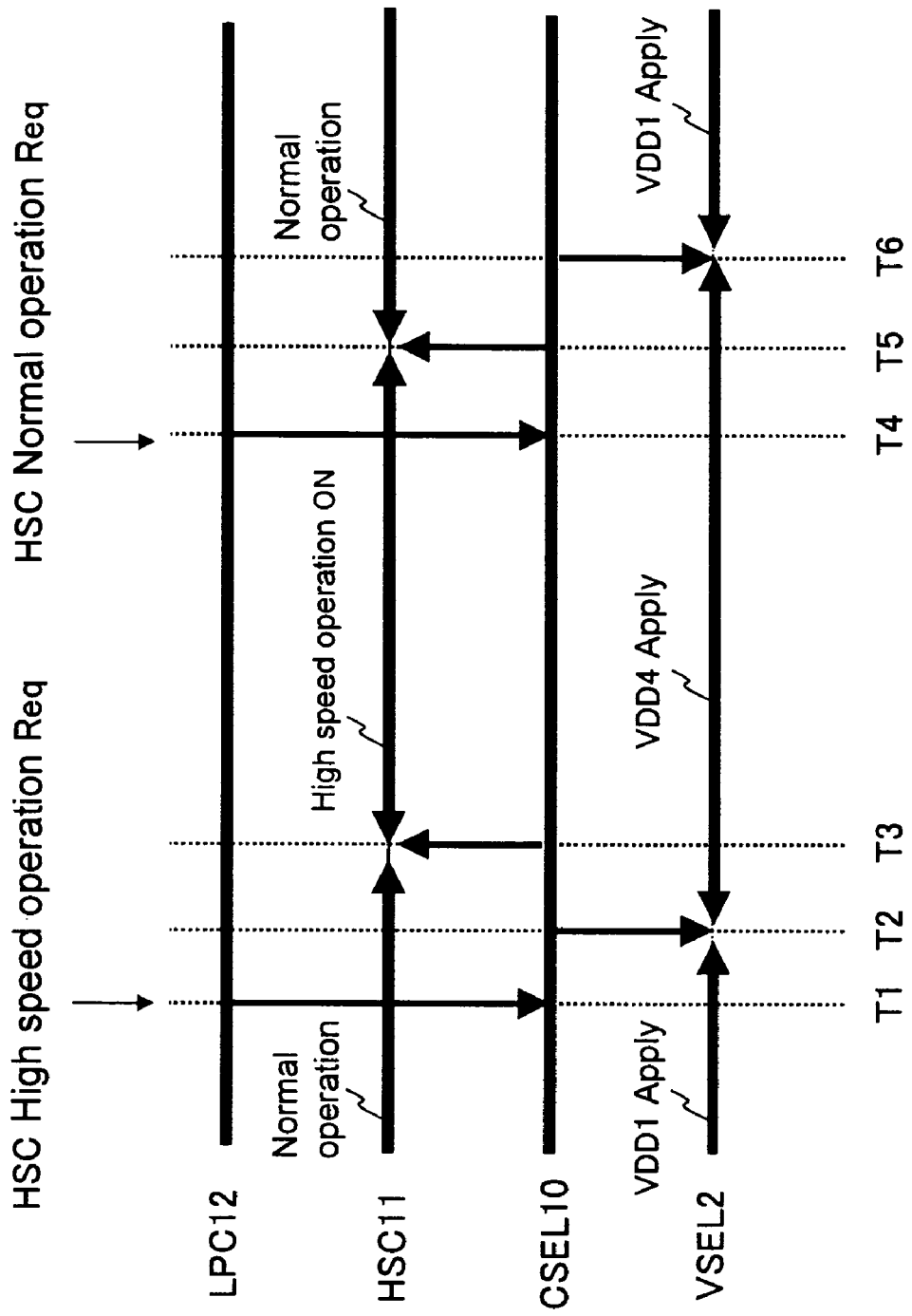
FIG. 21 is a timing chart showing a main part in the microprocessor illustrated in FIG. 20.

FIG. 21 shows a control timing of the dynamic voltage boost method.

At a time T1, a high speed operation request (Req) is generated for a high speed processor core 11 and a low power processor core 12 gives a notice of the request to a core selecting portion 10. At a time T2, the core selecting portion 10 transmits a switching signal from a power VDD1 to a power VDD4 to a voltage selector VSEL2. The voltage selector VSEL2 executes a switching control of a power supply from VDD1 to VDD4. After the stabilization of the power VDD4 is observed, the core selecting portion 10 issues a request for a high sped operation to the high speed processor core 11 at a time T3. It is also possible to carry out a control for causing the voltage selector (VSEL) 2 to transmit the stabilization of the voltage to the core selecting portion 10 after the power is switched, which is not shown.

Next, description will be given to the case in which the high speed processor core 11 is switched into an operation at an ordinary speed (a normal operation).

At a time T4, a normal operation request (Req) is generated and is transmitted from the low power processor core 12 to the core selecting portion 10. Upon receipt of the signal, the core selecting portion 10 issues a request signal from a high speed operation mode to a normal operation mode to the high speed processor core 11 at a time T5. Upon receipt of the signal, the high speed processor core 11 carries out a transition from the high speed operation mode to the normal operation mode. After the high speed processor core 11 starts the normal operation, thereafter, the core selecting portion 10 issues a switching request in order to supply the power VDD1 to the voltage selector VSEL2 at a time T6. Consequently, the voltage selector VSEL2 applies the power VDD1. By carrying out such a control, it is possible to achieve a control making the most of the performance of the LSI.

Figure 22:
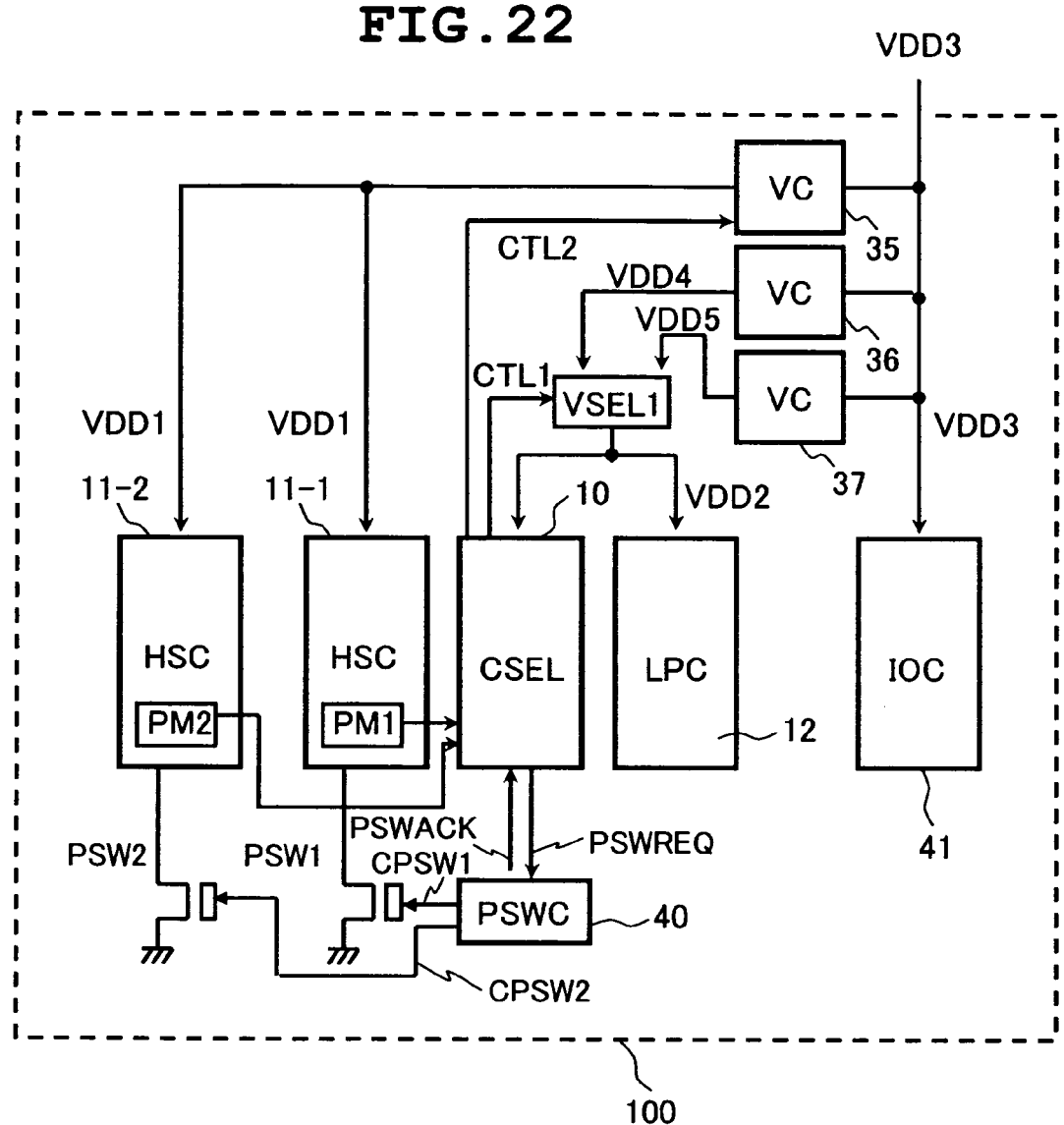
FIG. 22 is a block diagram showing a further example of the structure of the microprocessor according to the example of the semiconductor integrated circuit in accordance with the invention.

FIG. 22 shows a further example of the structure of the microprocessor according to the example of the semiconductor integrated circuit in accordance with the invention.

In the example, performance monitors PM1 and PM2 are mounted in a plurality of high speed processor cores 11-1 and 11-2. A source voltage is controlled and a power switch control is carried out in response to outputs of the performance monitors PM1 and PM2. The performance monitors serve to monitor a consumed current and a temperature in a core. Moreover, power switches PSW1 and PSW2 are provided corresponding to the high speed processor cores 11-1 and 11-2 and their operations are controlled by a control circuit (PSWC) 40.

In the structure, description will be given to the case in which a current consumption is converted into a fluctuation in a voltage and an evaluation is thus carried out when a current is to be monitored.

In this case, the fluctuation in a voltage is detected and transmitted to a core selecting portion 10. When detecting that the voltage is dropped, the core selecting portion 10 transmits the drop in the voltage to a voltage regulating circuit (VC5) 35 to carry out such a control as to raise a power VDD1. The control is carried out by using a control signal CTL2. In the case in which it is detected that a temperature is raised, moreover, the core selecting portion 10 transmits the rise in the operating temperature of the high speed processor core 11 to a low power processor core 12 and determines whether the processing of the high speed processor core 11 is carried out continuously in the low power processor core 12 or not. In the case in which a temperature level is equal to or lower than a temperature level of a thermorunaway, the voltage is raised to carry out such a control that a high speed processing can be executed. In the case in which there is a possibility that the thermorunaway might be caused, however, a control is carried out to temporarily hold the operation of the high speed processor core 11. At this time, in the case in which a plurality of high speed processor cores 11-1 and 11-2 are integrated on one chip as shown, it is also possible to obtain an advantage that a delay of a calculation processing is eliminated if a nonused core is caused to take over a subsequent data processing, thereby stopping the operation of a core having a high temperature. Referring to a temperature decision, it is preferable to have a table for classifying the temperature stepwise. For example, it is preferable to carry out the control by classifying the temperature into three types, that is, "an ordinary temperature", "an operation enable high temperature" and "an operation disable high temperature". It is desirable that a thermometer device having a hysteresis should be used as a thermometer. Consequently, a control is carried out in order to output a normal voltages at the ordinary temperature and a control for raising the voltage of VDD1 is executed over the regulator at the "operation enable high temperature". Finally, the operation of the high speed processor core 11 is stopped to execute the radiation of the LSI12 at the "operation disable high temperature". In the case in which a plurality of high speed processor cores 11 is mounted on one LSI, it is desirable that a core having no rise in a temperature should be caused to take over a succeeding calculation and the power cutoff of the high speed processor core 11 should be executed. In the case in which a high temperature state is brought, moreover, it is suitable to transmit a signal to the outside of the chip and to execute cooling of the LSI, for example, to turn ON a fan on a board level, which is not shown.

Figure 23:
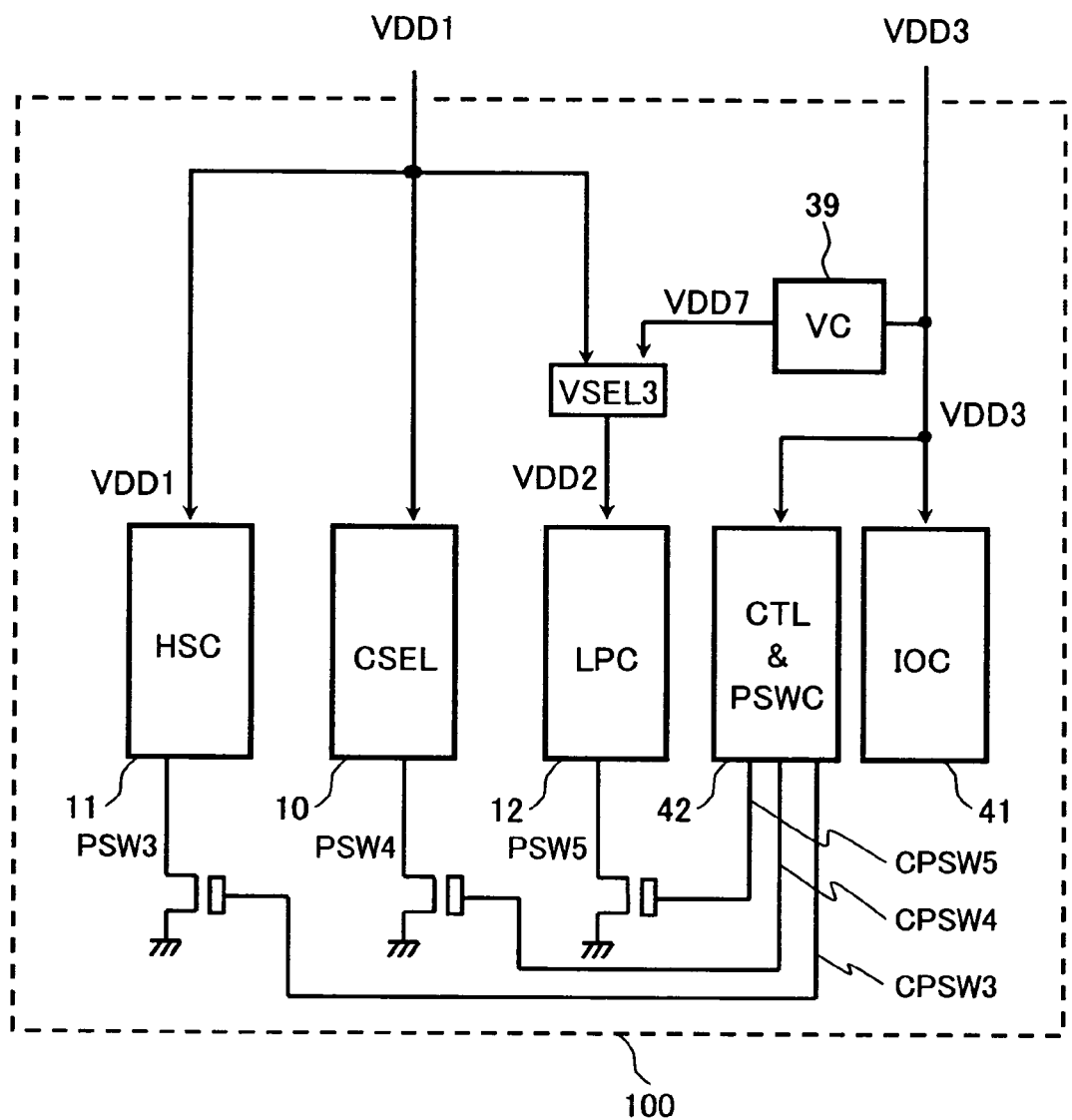
FIG. 23 is a block diagram showing a further example of the structure of the microprocessor according to the example of the semiconductor integrated circuit in accordance with the invention.

FIG. 23 shows a further example of the structure of the microprocessor according to the example of the semiconductor integrated circuit in accordance with the invention.

In FIG. 23, a low power processor core 12 is also provided with a power switch PSW5.

In the example, power switches PSW3, PSW4 and PSW5 are provided in a high speed processor core 11, a core selecting portion 10 and the low power processor core 12. The power switches PSW3, PSW4 and PSW5 are ON/OFF controlled by means of a control circuit (CTRL&PSWC) 42. In the case in which the operations of the low power processor core 12 and the high speed processor core 11 are not required, that is, a chip itself does not need to be operated, consequently, it is possible to reduce a consumed power of a chip by turning OFF the power switch. By applying the example to the case in which a leakage current of the low power processor core 12 cannot be disregarded in a standby, it is possible to obtain great advantages. Such a structure can be applied to all of the examples in the same manner.

In FIG. 23, moreover, it is possible to carry out a control for switching a power supply for the low power processor core 12. The powers have a relationship of VDD1<VDD7. The power VDD7 is formed by a voltage regulating circuit (VC9) 39. Thus, it is possible to enhance an operating speed of the low power processor core 12 by switching an applied voltage from the power VDD1 to the power VDD7, for example. When the core of the low power processor core 12 is operated at a high speed, power consumption is increased. By limiting a period for operating the low power processor core 12 at a high speed very greatly, however, it is possible to reduce averaged power of the whole LSI.

Furthermore, FIG. 23 shows an example in which a controller (CTRL) for executing a control of the whole chip and a controller of the power switch are fabricated by an MISFET having a great thickness of a gate insulating film in the same manner as the MISFET used in the input/output circuit 41 and VDD3 is applied. With such a structure, it is possible to cause a leakage current per unit length of the MISFET to be considerably less than a leakage current of an MISFET constituting an LPC. In general, the controller for executing the control of the whole chip and the controller of the power switch have low working rates, and their operating frequencies may also be low in many cases. Even if these controllers are operated at VDD3 having a comparatively high voltage, accordingly, an operating current can be reduced much more greatly as compared with the operating powers of the high speed processor core 11 and the low power processor core 12. Furthermore, it is desirable that the MISFET constituting the controllers should be constituted by an MISFET corresponding to a 0.25 μm-rule or a 0.18 μm-rule. There is an advantage that the MISFET manufactured by these rules can have such a level that a leakage current can be almost disregarded and an area of the controller which is comparatively small.

While the invention made by the inventor has been specifically described above, the invention is not restricted thereto but it is apparent that various changes can be made without departing from the scope thereof.

While the description has been given to the case in which the invention made by the inventor is mainly applied to a microprocessor to be a utilization field which is the background thereof, the invention is not restricted thereto but can be widely applied to a semiconductor integrated circuit. The invention can be applied on the condition that a processor is included.

What is claimed is:

1. A semiconductor integrated circuit comprising:
a first processor to be operated at a first operating frequency;
a second processor having a leakage current that is less than that of the first processor and which is operated at a second operating frequency that is lower than the first operating frequency;
a selecting portion capable of selectively switching an executing destination of a software application into the first processor or the second processor according to a demanded operating speed of the software application,
a first switch controlling supply of an operating voltage to the first processor;
a first regulating circuit; and
a second regulating circuit whose voltage response performance is higher than a voltage response performance of the first regulating circuit,
wherein the first processor and the second processor can execute an identical instruction set, respectively,
wherein a first voltage is supplied to the first regulating circuit and the second regulating circuit,
wherein the first regulating circuit converts from the first voltage to a second voltage,
wherein the second regulating circuit converts from the first voltage to a third voltage,
wherein when the first switch is in an ON state, the selecting portion selects the second regulating circuit and the second regulating circuit supplies the third voltage to the second processor and the selecting portion, and
wherein when the first switch is in an OFF state, the selecting portion selects the first regulating circuit and the first regulating circuit supplies the second voltage to the second processor and the selecting portion.

2. The semiconductor integrated circuit according to claim 1,
wherein the selecting portion carries out the switching control of the first processor and the second processor through a task.

3. The semiconductor integrated circuit according to claim 1,
wherein the first processor and the second processor include transistors, and a threshold of the transistor constituting the first processor is set to be smaller than that of the transistor constituting the second processor.

4. The semiconductor integrated circuit according to claim 1,
wherein the first processor and the second processor include low threshold transistors which are set to be lower than predetermined threshold levels, respectively, and a layout is carried out in such a manner that a rate of the low threshold transistor in the first processor is higher than that of the low threshold transistor in the second processor.

5. The semiconductor integrated circuit according to claim 1,
wherein the first processor and the second processor include transistors respectively, a threshold of the transistor constituting the first processor is set to be smaller than that of the transistor constituting the second processor, and an operating voltage of the first processor is set to be lower than that of the second processor.

6. The semiconductor integrated circuit according to claim 1,
wherein the first processor and the second processor include transistors respectively, a thickness of a gate insulating film of the transistor constituting the first processor is set to be smaller than that of a gate insulating film of the transistor constituting the second processor, and an operating voltage of the first processor is set to be lower than that of the second processor.

7. The semiconductor integrated circuit according to claim 1,
wherein the first processor and the second processor include transistors respectively, a thickness of a gate insulating film of the transistor constituting the first processor is set to be smaller than that of a gate insulating film of the transistor constituting the second processor, a threshold of the transistor constituting the first processor is set to be smaller than that of the transistor constituting the second processor, and an operating voltage of the first processor is set to be lower than that of the second processor.

8. The semiconductor integrated circuit according to claim 1, further comprising:
a third regulating circuit which converts the first voltage to a fourth voltage and supplies the fourth voltage to the first processor,
wherein the first processor comprises a first performance monitor which monitors a fluctuation in a voltage in the first processor, and
wherein if the first performance monitor detects that the voltage in the first processor drops, the selecting portion causes the third regulating circuit to raise the fourth voltage.

9. The semiconductor integrated circuit according to claim 1, further comprising:
a third regulating circuit which converts the first voltage to a fourth voltage and supplies the fourth voltage to the first processor,
wherein the first processor comprises a first performance monitor which monitors a temperature in the first processor,
wherein the selecting portion has a table classifying the temperature in the first processor as a first type, a second type, or a third type,
wherein the first type indicates that the first processor has an ordinary temperature,
wherein the second type indicates that the first processor has a higher temperature than the first type and is enabled to operate,
wherein the third type indicates that the first processor is disabled from operating,
wherein if the first performance monitor detects that the temperature in the first processor is the second type, the selecting portion causes the third regulating circuit to raise the fourth voltage, and
wherein if the first performance monitor detects that the temperature in the first processor is the third type, the selecting portion causes the first processor to stop executing.

10. The semiconductor integrated circuit according to claim 1,
wherein a power efficiency of the first regulating circuit is higher than a power efficiency of the second regulating circuit.

11. The semiconductor integrated circuit according to claim 1,
wherein the second voltage is lower than the first voltage, and
wherein the third voltage is lower than the first voltage.

12. A semiconductor integrated circuit comprising:
a first core including a first CPU and a first cache memory coupled to the first CPU;
a second core including a second CPU and a second cache memory coupled to the second CPU;
an input/output circuit capable of transferring data between the first core and second core and externally to the first and second cores;
a first switch controlling supply of an operating voltage to the first core;
a first regulating circuit; and
a second regulating circuit whose voltage response performance is higher than a voltage response performance of the first regulating circuit,
wherein a first voltage is supplied to the first regulating circuit and the second regulating circuit,
wherein the first regulating circuit converts from the first voltage to a second voltage,
wherein the second regulating circuit converts from the first voltage to a third voltage,
wherein when the first switch is in an ON state, the second regulating circuit supplies the third voltage to the second core,
wherein when the first switch is in an OFF state, the first regulating circuit supplies the second voltage to the second core,
wherein the first core and the second core are connected to a common bus and the first core is set to have a higher operating frequency than the second core,
the first core, the second core and the input/output circuit include transistors, respectively, and
a first threshold of the transistor constituting the first core is set to be smaller than a second threshold of the transistor constituting the second core, and the first threshold and the second threshold are set to be smaller than a third threshold of the transistor constituting the input/output circuit.

13. A semiconductor integrated circuit comprising:
a first core including a first CPU and a first cache memory coupled to the first CPU;
a second core including a second CPU and a second cache memory coupled to the second CPU;
an input/output circuit capable of transferring data between the first core and second core and externally to the first and second cores;
a first switch controlling supply of an operating voltage to the first core;

a first regulating circuit; and a second regulating circuit whose voltage response performance is higher than a voltage response performance of the first regulating circuit, wherein a first voltage is supplied to the first regulating circuit and the second regulating circuit, wherein the first regulating circuit converts from the first voltage to a second voltage, wherein the second regulating circuit converts from the first voltage to a third voltage, wherein when the first switch is in an ON state, the second regulating circuit supplies the third voltage to the second core, wherein when the first switch is in an OFF state, the first regulating circuit supplies the second voltage to the second core, wherein the first core and the second core are connected to a common bus and the first core is set to have a higher operating frequency than the second core, the first core, the second core and the input/output circuit include transistors, respectively, and a thickness of a first gate insulating film of the transistor constituting the first core is set to be smaller than that of a second gate insulating film of the transistor constituting the second core, the thickness of the second gate insulating film of the transistor constituting the second core is set to be smaller than that of a third gate insulating film of the transistor constituting the input/output circuit, a voltage to be applied to the first core is set to be lower than a source voltage to be applied to the second core, and the source voltage to be applied to the second core is set to be lower than a source voltage of the input/output circuit.

* * * * *